United States Patent
Hisatake et al.

(10) Patent No.: US 10,451,663 B2
(45) Date of Patent: Oct. 22, 2019

(54) METHOD FOR MEASURING ELECTROMAGNETIC FIELD, ELECTROMAGNETIC FIELD MEASUREMENT DEVICE, AND PHASE IMAGING DEVICE

(71) Applicant: OSAKA UNIVERSITY, Osaka (JP)

(72) Inventors: Shintarou Hisatake, Osaka (JP); Tadao Nagatsuma, Osaka (JP)

(73) Assignee: OSAKA UNIVERSITY, Osaka (JP)

( * ) Notice: Subject to any disclaimer, the term of this patent is extended or adjusted under 35 U.S.C. 154(b) by 77 days.

(21) Appl. No.: 15/751,697

(22) PCT Filed: Aug. 9, 2016

(86) PCT No.: PCT/JP2016/073482
§ 371 (c)(1),
(2) Date: Feb. 9, 2018

(87) PCT Pub. No.: WO2017/026494
PCT Pub. Date: Feb. 16, 2017

(65) Prior Publication Data
US 2018/0238948 A1 Aug. 23, 2018

(30) Foreign Application Priority Data

Aug. 11, 2015 (JP) .................... 2015-158917
Mar. 7, 2016 (JP) .................... 2016-043860

(51) Int. Cl.
*G01R 29/08* (2006.01)
*G01R 29/10* (2006.01)

(52) U.S. Cl.
CPC ......... *G01R 29/0885* (2013.01); *G01R 29/08* (2013.01); *G01R 29/0814* (2013.01); *G01R 29/10* (2013.01)

(58) Field of Classification Search
None
See application file for complete search history.

(56) References Cited

U.S. PATENT DOCUMENTS 4,461,363 A * 7/1984 Loy .................... G01G 9/00
177/1
5,125,108 A 6/1992 Talwar
(Continued)

FOREIGN PATENT DOCUMENTS

| FR | 2683048 | 4/1993 |
|---|---|---|
| JP | 2005-134169 | 5/2005 |
| JP | 2007-57324 | 3/2007 |

OTHER PUBLICATIONS

Extended European Search Report dated Mar. 28, 2019 in corresponding European Patent Application No. 16835191.4.
(Continued)

*Primary Examiner* — Paresh H Patel
(74) *Attorney, Agent, or Firm* — Wenderoth, Lind & Ponack, L.L.P.

(57) ABSTRACT

An electromagnetic field measurement device includes a first probe and a second probe arranged in a space to measure an electric field, a reference signal generator that generates a reference signal, a first multiplier that multiplies the reference signal by a signal obtained via the first probe, a second multiplier that multiplies a signal obtained via the second probe by the signal output from the first multiplier, and a synchronous detector that extracts a signal component that is synchronous with the reference signal from the signal output from the second multiplier.

14 Claims, 18 Drawing Sheets

(56) References Cited

U.S. PATENT DOCUMENTS

| | | | |
|---|---|---|---|
| 2008/0082274 A1 | 4/2008 | Kazama | |
| 2010/0048143 A1* | 2/2010 | Wendler | G01R 29/26 |
| | | | 455/67.13 |
| 2015/0369898 A1* | 12/2015 | Torin | G01R 25/00 |
| | | | 324/750.02 |

OTHER PUBLICATIONS

International Search Report (ISR) dated Nov. 8, 2016 in International (PCT) Application No. PCT/JP2016/073482.

* cited by examiner

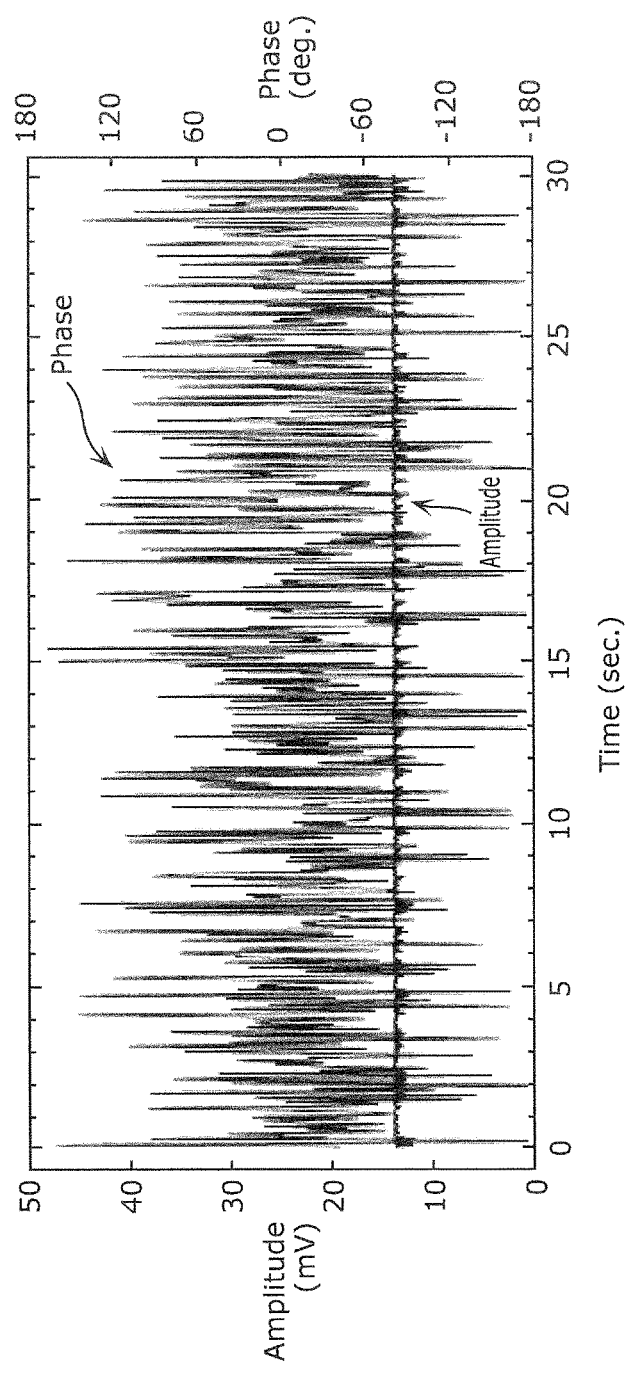

METHOD FOR MEASURING ELECTROMAGNETIC FIELD, ELECTROMAGNETIC FIELD MEASUREMENT DEVICE, AND PHASE IMAGING DEVICE

TECHNICAL FIELD

The present disclosure relates to a method for measuring an electromagnetic field and an electromagnetic field measurement device, and in particular relates to a method for measuring an electromagnetic field that is suitable for stably and precisely measuring a spatial distribution of the amplitude and phase of a radiation electric field or radiation magnetic field.

BACKGROUND ART

Measurement of a spatial distribution of the amplitude and phase of a radiation electric field or radiation magnetic field is necessary for, for example, analysis of a radiation pattern from an antenna.

Conventionally, a method of synchronizing the system to be measured and the measuring system is known as one example of a technique for measuring a spatial distribution of the amplitude and phase of a radiation electric field or radiation magnetic field (for example, see Patent Literature (PTL) 1).

CITATION LIST

Patent Literature

[PTL 1] Japanese Unexamined Patent Application Publication No. 2005-134169

SUMMARY

Technical Problem

However, with the method of synchronizing the system to be measured and the measuring system, when a synchronous signal cannot be injected into the signal generation source from an external source, for example, when the signal generation source and the radiating body such as an antenna are an integrated circuit (i.e., when an on-chip antenna is used), it is necessary to synchronize the measurement system with the signal to be measured in order to measure phase. However, it is typically difficult to configure a phase locked loop having a wide lock range.

In view of this, the present disclosure has an object to provide a method for measuring an electromagnetic field, an electromagnetic field measurement device, and a phase imaging device capable of stably and precisely measuring a spatial distribution of an electric field or magnetic field, without having to synchronize the system to be measured with the measuring system.

Solutions to Problem

In order to achieve the above object, a method for measuring an electromagnetic field according to one aspect of the present disclosure includes the steps of: (a) arranging a first probe and a second probe in a space to measure an electric field or a magnetic field; (b) multiplying a reference signal generated by a reference signal generator by a signal obtained via the first probe; (c) multiplying a signal obtained via the second probe by a signal obtained via step (b); and (d) extracting, from a signal obtained via step (c), a signal component that is synchronous with the reference signal generated by the reference signal generator.

With this, phase and frequency fluctuations of the electric field or magnetic field in the target electromagnetic field are cancelled with the use of two probes arranged in the target electromagnetic field. Accordingly, even when the frequency of the electric field or magnetic field in the target electromagnetic field changes, it is possible to measure the spatial distribution of the electric field or magnetic field stably and with precision, without having to synchronize the system to be measured and the measuring system. As a result, the radiation pattern from the integrated circuit of the signal generation source and radiating body such as an antenna (on-chip antenna) can be measured without having to synchronize the system to be measured and the measuring system.

Here, in step (a), while the second probe is fixed in the space, the first probe may be arranged at a plurality of measurement points in the space by sequentially moving the first probe to the plurality of measurement points. Step (b), step (c), and step (d) may be performed each time the first probe is arranged at a measurement point among the plurality of measurement points in step (a).

With this, by sequentially moving the first probe to a plurality of measurement points in the space and repeatedly performing the measuring, a spatial distribution of the amplitude and phase of the electric field or magnetic field in the target electromagnetic field is measured.

Moreover, in step (a), while a distance between the first probe and the second probe is fixed, the first probe and the second probe may be arranged at a plurality of measurement points in the space by sequentially moving the first probe and the second probe together to the plurality of measurement points. Step (b), step (c), and step (d) may be performed each time the first probe and the second probe are arranged at a measurement point among the plurality of measurement points in step (a).

With this, even in a state in which it is difficult to fix one of the first probe and the second probe and scan the other of the first probe and the second probe in the space, the phase relationship between measurement points can be calculated, and as a result, it is possible to measure the spatial distribution of the amplitude and phase of the electric field or magnetic field in the target electromagnetic field.

Moreover, in step (a), the first probe and the second probe may be moved together such that a position of one of the first probe and the second probe at a current one of the plurality of measurement points and a position of an other of the first probe and the second probe at a next one of the plurality of measurement points are a same point.

With this, regarding the phases at a plurality of measurement points, the phase relationship between two adjacent measurement points is measured, and as a result, the phase at all of the measurement points is measured.

Moreover, in step (a), the first probe and the second probe may be moved together such that one of the first probe and the second probe is sequentially arranged at a plurality of positions obtained by dividing the distance between the first probe and the second probe at a predetermined point in time.

With this, a phase relationship between measurement points at a distance shorter than the distance between the first probe and second probe, that is to say, at a high spatial resolution, is calculated, and as a result, the spatial distribution of the amplitude and phase of the electric field or magnetic field in the target electromagnetic field is measured.

The method may further include a step of (e) calculating an offset phase of the reference signal by (i) multiplying the reference signal by the signal obtained via the first probe, (ii) multiplying a signal resulting from (i) by the signal obtained via the first probe, and (iii) extracting a signal component that is synchronous with the reference signal from a signal resulting from (ii).

With this, when a plurality of probes are moved together, the offset phase of the reference signal is calculated simultaneously with the measurement of the target electromagnetic field, and it is possible to calculate the phase difference with high precision by subtracting the offset phase $\phi_{off}$ as noise from the phase of the signal component extracted in the synchronous detection step.

The method may further include a step of (e) calculating an offset phase of the reference signal by performing step (b), step (c), and step (d) in a state in which, for one of the plurality of measurement points, positions of the first probe and the second probe are reversed, and, in step (a), adding a phase of a signal component extracted in step (d) and a phase of a signal component extracted in step (d) after reversing the positions.

With this, when a plurality of probes are moved together, the offset phase of the reference signal can be calculated by reversing the positions of the probes, and the phase difference can be calculated with high precision by subtracting the offset phase as noise from the phase of the signal component extracted in the synchronous detection step.

Moreover, in order to achieve the above object, an electromagnetic field measurement device according to one aspect of the present disclosure includes: a first probe and a second probe arranged in a space to measure an electric field or a magnetic field; a reference signal generator that generates a reference signal; a first multiplier that multiplies the reference signal by a signal obtained via the first probe; a second multiplier that multiplies a signal obtained via the second probe by a signal output from the first multiplier; and a synchronous detector that extracts, from a signal output from the second multiplier, a signal component that is synchronous with the reference signal.

With this, by using two probes arranged in the target electromagnetic field, phase and frequency fluctuations of the electric field or magnetic field in the target electromagnetic field are cancelled. Accordingly, even when the frequency of the electric field or magnetic field in the target electromagnetic field changes, it is possible to measure the spatial distribution of the electric field or magnetic field stably and with precision, without having to synchronize the system to be measured and the measuring system. As a result, the radiation pattern from the integrated circuit of the signal generation source and radiating body such as an antenna (on-chip antenna) can be measured without having to synchronize the system to be measured and the measuring system.

Here, the electromagnetic field measurement device may further include: a first frequency converter that converts a frequency of a signal output from the first probe into an intermediate frequency lower than a frequency of the signal output from the first probe; and a second frequency converter that converts a frequency of a signal output from the second probe into the intermediate frequency. The first multiplier may multiply the reference signal by a signal output from the first frequency converter. The second multiplier may multiply a signal output from the second frequency converter by the signal output from the first multiplier.

With this, since the frequency of the signals (RF signals) dependent on the amplitude and phase of the target electric field or target magnetic field output from the two probes are down-converted, even electromagnetic fields having a relatively high frequency (for example, an electromagnetic field of microwaves, millimeter waves, terahertz waves) can be measured.

The electromagnetic field measurement device may further include: a filter that selects, from the signal output from the first multiplier, a signal component having a frequency that is a sum of or a difference between a frequency of a signal input into the first multiplier and a frequency of the reference signal. The second multiplier may multiply a signal output from the second probe by a signal output from the filter.

With this, unwanted signal components whose frequency is equivalent to the difference or sum of the frequencies of the signal input into the first multiplier and the reference signal are removed from the signal output from the first multiplier, whereby only those necessary signal components whose frequency is equivalent to the sum or difference are selected and output. Accordingly, subsequent signal processing can be performed stably.

Moreover, the first probe and the second probe may output optical signals dependent on a detected electric field. The first frequency converter may convert the optical signal output from the first probe into an electric signal having an intermediate frequency lower than a frequency of the optical signal output from the first probe. The second frequency converter may convert the optical signal output from the second probe into an electric signal having the intermediate frequency. The first multiplier may multiply the reference signal by the electric signal output from the first frequency converter. The second multiplier may multiply the electric signal output from the second frequency converter by the signal output from the first multiplier.

With this, since the signals output and processed from the two probes are optical signals, even electromagnetic fields having a relatively high frequency (for example, an electromagnetic field of microwaves, millimeter waves, terahertz waves) can be stably measured.

Moreover, in order to achieve the above object, an electromagnetic field measurement device according to one aspect of the present disclosure includes: a first probe and a second probe arranged in a space to measure an electric field or a magnetic field; a first analog/digital (A/D) converter that converts a signal obtained via the first probe into a digital value; a second A/D converter that converts a signal obtained via the second probe into a digital value; and a computer device that processes signals output from the first A/D converter and the second A/D converter. The computer device may execute steps of: (a) multiplying a reference signal by the signal output from the first A/D converter; (b) multiplying the signal output from the second A/D converter by a signal obtained via step (a); and (c) extracting, from a signal obtained via step (b), a signal component that is synchronous with the reference signal.

With this, since the noise cancellation processing is implemented via digital signal processing, high-precision, stable signal processing can be performed via a logical circuit including a digital signal processor (DSP) or digital filter, field-programmable gate array (FPGA), etc., or a program.

Moreover, in order to achieve the above object, a phase imaging device according to one aspect of the present disclosure measures and images a shift in phase of an electromagnetic wave when transmitting through or reflecting off an object, and includes: an electromagnetic wave source that emits the electromagnetic wave; an optical device that splits the electromagnetic wave emitted from the electromagnetic wave source into a first electromagnetic wave and a second electromagnetic wave; a mechanism configured to change a relative positional relationship between the object and the first electromagnetic wave such that only the first electromagnetic wave among the first electromagnetic wave and the second electromagnetic wave split by the optical device is sequentially scanned across a plurality of measurement points in a two-dimensional plane on the object; the above-described electromagnetic field measurement device that measures, at each of the plurality of measurement points, a difference in phase between the first electromagnetic wave that has transmitted through or reflected off the object and the second electromagnetic wave that has not transmitted through or reflected off the object; and an imaging device that images the difference in phase measured by the electromagnetic field measurement device in correspondence to each of the plurality of measurement points. The electromagnetic field measurement device may detect the first electromagnetic wave using the first probe included in the electromagnetic field measurement device and the second electromagnetic wave using the second probe included in the electromagnetic field measurement device. The imaging device may image a phase of the signal component extracted by the synchronous detector included in the electromagnetic field measurement device as the difference in phase.

With this, even when an electromagnetic wave source exhibiting frequency fluctuation is used, it is possible to perform stable, high-precision phase imaging since imaging via phase difference in which frequency fluctuation has been cancelled is performed.

Note that implementation of the present disclosure is not limited to the method for measuring an electromagnetic field and the electromagnetic field measurement device described above. The present disclosure may be implemented as a computer program including steps that a computer including the above-described electromagnetic field measurement device executes. The present disclosure may also be implemented as a computer-readable recording medium, such as a CD-ROM, on which the program is recorded.

Advantageous Effects

The present disclosure provides a method for measuring an electromagnetic field and an electromagnetic field measurement device that can stably and precisely measure the spatial distribution of an electric field or magnetic field without having to synchronize the system to be measured and the measuring system.

Accordingly, in today's world in which wireless telecommunications devices including integrated circuits, such as cellular phones and smart phones, are widely used, the practical value of the present disclosure, which is suitable for, for example, analyzing radiation patterns from antennas, is significantly high.

BRIEF DESCRIPTION OF DRAWINGS

FIG. 4B illustrates the waveform of a detection signal obtained by signal processing according to conventional techniques.

DESCRIPTION OF EMBODIMENTS

Hereinafter embodiments of the present disclosure will be described in detail with reference to the drawings. The embodiments described below are specific preferred examples. The numerical values, shapes, materials, elements, the arrangement and connection of the elements, steps, the order of the steps, etc., in the following embodiments are mere examples, and therefore are not intended to limit the present disclosure. Therefore, among the elements in the following exemplary embodiments, those not recited in any of the independent claims defining the broadest the concept of the present disclosure are described as optional elements for achieving a more preferable embodiment.

Figure 1:
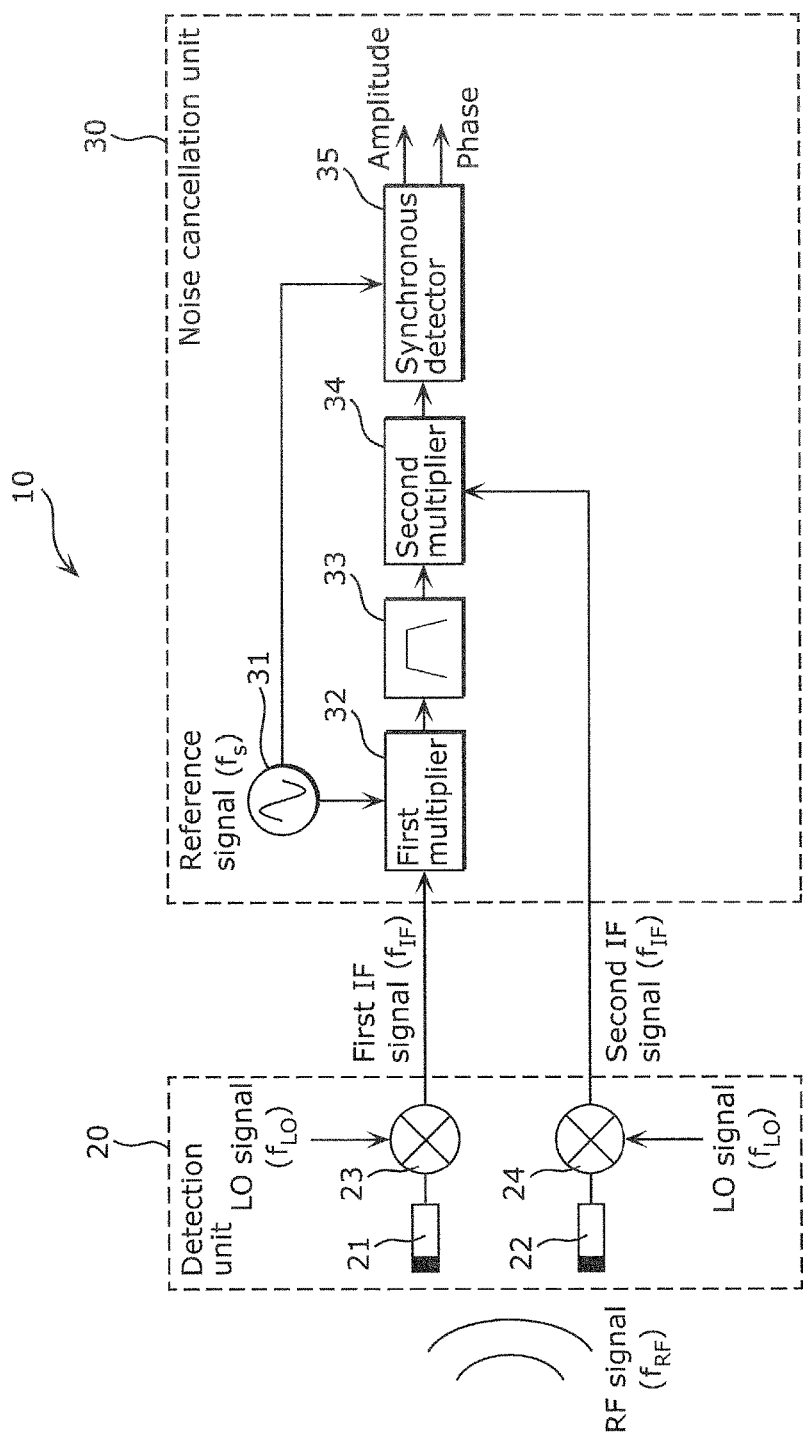
FIG. 1 is a block diagram illustrating a configuration of an electromagnetic field measurement device according to an embodiment of the present disclosure.

FIG. 1 is a block diagram illustrating a configuration of an electromagnetic field measurement device 10 according to an embodiment of the present disclosure. The electromagnetic field measurement device 10 is a device that measures a spatial distribution of the amplitude and phase of a radiation electric field or a radiation magnetic field of, for example, an antenna. Broadly speaking, the electromagnetic field measurement device 10 is configured of a detection unit 20 and a noise cancellation unit 30.

The detection unit 20 includes a first probe 21, a second probe 22, a first frequency converter 23, and a second frequency converter 24, and is a processing unit for detecting the electric field or magnetic field in a target electromagnetic field, which is the electromagnetic field to be measured by the two probes.

The first probe 21 is an electric field probe or magnetic field probe used for taking measurements, and is arranged at measurement points in a space covered by the target electromagnetic field. The first probe 21 outputs a signal (RF signal) dependent on the amplitude and phase of the target electric field or target magnetic field measured at a measurement point. Note that the measurement points are predetermined spatial positions for measuring a spatial distribution of the amplitude and phase of the target electric field or target magnetic field. For example, the measurement points are lattice points of a one-, two-, or three-dimensional grid.

The second probe 22 is an electric field probe or magnetic field probe used for reference, and is arranged fixed in place at a reference point in a space covered by the target electromagnetic field. The second probe 22 outputs a signal (RF signal) dependent on the amplitude and phase of the target electric field or target magnetic field measured at the reference point. Note that the reference point is a position for detecting a phase to be used as a reference for the phase of the target electric field or target magnetic field to be measured at the measurement point. The reference point may be any position within the space covered by the target electromagnetic field.

Note that in this embodiment, the first probe 21 and the second probe 22 are exemplified as probes used for electric field measurement (electric field probes).

The first frequency converter 23 is a down-converter that converts the frequency of the RF signal output from the first probe 21 into a lower intermediate frequency (IF). For example, the first frequency converter 23 is a mixer that mixes the RF signal output from the first probe 21 and a local oscillator (LO) signal output from a local oscillator (not illustrated in the drawings) to convert the RF signal into a first IF signal whose frequency is equivalent to the difference in the frequencies (i.e., the intermediate frequency) of the RF and LO signals. More specifically, the first frequency converter 23 generates the first IF signal having an intermediate frequency $f_{IF}$ ($=|f_{RF}-f_{LO}|$), where the frequency of the RF signal output from the first probe 21 is $f_{RF}$ and the frequency of the LO signal is $f_{LO}$.

The second frequency converter 24 is a down-converter that converts the frequency of the RF signal output from the second probe 22 into an intermediate frequency (IF) equivalent to the frequency of the signal output from the first frequency converter 23. For example, the second frequency converter 24 is a mixer that mixes the RF signal output from the second probe 22 and the above-described LO signal to convert the RF signal into a second IF signal whose frequency is equivalent to the difference in the frequencies (i.e., the intermediate frequency) of the RF and LO signals. More specifically, the second frequency converter 24 generates the second IF signal having an intermediate frequency $f_{IF}$ ($=|f_{RF}-f_{LO}|$), where the frequency of the RF signal output from the second probe 22 is $f_{RF}$ and the frequency of the LO signal is $f_{LO}$.

Note that the first frequency converter 23 and the second frequency converter 24 may be provided in cases where the frequencies of the RF signals output from the first probe 21 and the second probe 22 are relatively high (for example, are microwaves, millimeter waves, terahertz waves, etc.), and may be omitted in cases where the frequencies of the RF signals are relatively low, namely approximately tens of MHz or lower. In cases where the first frequency converter 23 and the second frequency converter 24 are omitted, the RF signal output from the first probe 21 is input directly into the first multiplier 32 in the noise cancellation unit 30 and the RF signal output from the second probe 22 is input directly into the second multiplier 34 in the noise cancellation unit 30.

The noise cancellation unit 30 is a processing unit for cancelling phase and frequency fluctuations (including relative frequency fluctuations between the RF signal and the LO signal) in the electric field or magnetic field in the target electromagnetic field, and includes a reference signal generator 31, the first multiplier 32, a filter 33, the second multiplier 34, and a synchronous detector 35. Note that in this embodiment, the noise cancellation unit 30 functions as a processing unit for cancelling phase and frequency fluctuations in the target electric field.

The reference signal generator 31 is a circuit that generates a reference signal used to cancel the phase and frequency fluctuations described above, and, for example, generates a signal at a single frequency fs.

The first multiplier 32 is a multiplier that multiplies the reference signal generated by the reference signal generator 31 by the signal obtained via the first probe 21, and, for example, is an analog multiplier or mixer. In this embodiment, since the first frequency converter 23 is connected after the first probe 21, the first multiplier 32 multiplies the reference signal generated by the reference signal generator 31 by the first IF signal output from the first frequency converter 23, and as a result, outputs a signal including a signal component whose frequency is equivalent to the sum of the frequency of the signal input into first multiplier 32 (here, the intermediate frequency $f_{IF}$) and the frequency fs of the reference signal (i.e., $fs+f_{IF}$) and a signal component whose frequency is equivalent to the difference between the frequency of the signal input into first multiplier 32 (here, the intermediate frequency $f_{IF}$) and the frequency fs of the reference signal (i.e., $fs-f_{IF}$).

The filter 33 is a circuit that selects, from the signal output from the first multiplier 32, a signal component whose frequency is equivalent to the sum or difference (in this embodiment, the difference ($fs-f_{IF}$)) of the frequency of the signal input into first multiplier 32 (here, the intermediate frequency $f_{IF}$) and the frequency fs of the reference signal, and, for example, is a bandpass filter or low-pass filter. Note that depending on the relationship between the frequency of the RF signal and the frequency of the LO signal, the filter 33 may not be required.

The second multiplier 34 is a multiplier that multiplies the signal obtained via the second probe 22 by the signal output from the first multiplier 32, and, for example, is an analog multiplier or mixer. In this embodiment, since the filter 33 is connected after the first multiplier 32 and the second frequency converter 24 is connected after the second probe 22, the second multiplier 34 multiplies the second IF signal output from the second frequency converter 24 by the signal output from the filter 33, and as a result, outputs a signal including a signal component whose frequency fs is equivalent to the sum of the frequency (fs–$f_{IF}$) of the signal output from the filter 33 and the frequency ($f_{IF}$) of the second IF signal (i.e., =fs–$f_{IF}$+$f_{IF}$) and a signal component whose frequency is equivalent to the difference between the frequency (fs–$f_{IF}$) of the signal output from the filter 33 and the frequency ($f_{IF}$) of the second IF signal (i.e., fs–2$f_{IF}$).

The synchronous detector 35 is a circuit that extracts a signal component synchronous with the reference signal (i.e., a signal component having the frequency fs) from the signal output from the second multiplier 34, and, for example, is a lock-in amplifier that receives an input of the signal output from the second multiplier 34 and extracts only the signal component that is synchronous with the reference signal generated by the reference signal generator 31. The detection signal output by the synchronous detector 35 indicates the amplitude and phase of the target electric field at the measurement point at which the first probe 21 is arranged (the phase being based on the phase of the target electric field at the reference point at which the second probe 22 is arranged in the target electric field). In this way, with the synchronous detector 35, only the signal component in the signal output from the second multiplier 34 having the frequency fs (=$f_s$–$f_{IF}$+$f_{IF}$) of the reference signal obtained by cancelling the phase and frequency fluctuations in the target electric field and cancelling the signal component dependent on the intermediate frequency is extracted to identify the amplitude and phase of the target electric field.

Note that a filter (e.g., bandpass filter) that selects only the signal component in the signal output from the second multiplier 34 having the frequency fs may be disposed between the second multiplier 34 and the synchronous detector 35.

Next, operations and measurement principles of the electromagnetic field measurement device 10 according to this embodiment and having the above-described configuration will be described.

The RF signal output from the first probe 21 is input into the first frequency converter 23 and mixed with a LO signal in the first frequency converter 23 to convert the RF signal into a signal whose frequency is equivalent to the difference in the frequencies (i.e., the intermediate frequency) of the RF and LO signals. The signal Sa output from the first frequency converter 23 is expressed by Equation 1 shown below.

$$Sa = A_1 \cos\{2\pi f_{IF} t + \Phi_n(t) + \Delta\Phi\} \quad \text{Equation 1}$$

Here, $A_1$ corresponds to the amplitude of the target electric field at the measurement point at which the first probe 21 is arranged, $f_{IF}$ is the intermediate frequency, $\Phi_n(t)$ is the phase fluctuation of the target electric field, and $\Delta\Phi$ is the phase of the target electric field at the measurement point (the phase being based on the phase of the target electric field at the reference point at which the second probe 22 is arranged). Note that when the first frequency converter 23 is omitted, Equation 1 given above expresses an output signal from the first probe 21. In such cases, $f_{IF}$ is the frequency of the target electric field (the frequency of the RF signal).

On the other hand, the RF signal output from the second probe 22 is input into the second frequency converter 24 and mixed with a LO signal in the second frequency converter 24 to convert the RF signal into a signal whose frequency is equivalent to the difference in the frequencies (i.e., the intermediate frequency) of the RF and LO signals. The signal Sb output from the second frequency converter 24 is expressed by Equation 2 shown below.

$$Sb = A_2 \cos\{2\pi f_{IF} t + \Phi_n(t)\} \quad \text{Equation 2}$$

Here, $A_2$ corresponds to the amplitude of the target electric field at the reference point at which the second probe 22 is arranged, $f_{IF}$ is the intermediate frequency, and $\Phi_n(t)$ is the phase fluctuation of the target electric field. Note that when the second frequency converter 24 is omitted, Equation 2 given above expresses an output signal from the second probe 22. In such cases, $f_{IF}$ is the frequency of the target electric field (the frequency of the RF signal).

The signal output from the first frequency converter 23 is input into the first multiplier 32 and multiplied in the first multiplier 32 by the reference signal from the reference signal generator 31 to convert the signal into a signal including a signal component whose frequency is equivalent to the sum of the intermediate frequency and the frequency of the reference signal and a signal component whose frequency is equivalent to the difference between the intermediate frequency and the frequency of the reference signal. Then, the signal output from the first multiplier 32 is input into the filter 33, and in the filter 33, a signal component whose frequency is equivalent to the sum or difference (in this embodiment, difference) of the intermediate frequency and the frequency of the reference signal is selected. The signal Sc output from the filter 33 is expressed by Equation 3 shown below.

$$Sc = (A_1/2)\cos\{2\pi(f_s - f_{IF})t + \Phi_s - \Phi_n(t)\} \quad \text{Equation 3}$$

Here, $f_s$ is the frequency of the reference signal, and $\Phi_s$ is the phase of the reference signal relative to the phase of the target electric field.

The signal output from the filter 33 is input into the second multiplier 34 and multiplied by the signal Sb obtained via the second probe 22 in the second multiplier 34, and as a result, a signal is output that includes a signal component whose frequency is equivalent to the sum of the frequency of the signal Sc output from the filter 33 and the frequency of the signal Sb obtained via the second probe 22 and a signal component whose frequency is equivalent to the difference between the frequency of the signal Sc output from the filter 33 and the frequency of the signal Sb obtained via the second probe 22. The signal component Sd of the signal output from the second multiplier 34 whose frequency is equivalent to the sum of the frequency of the signal Sc output from the filter 33 and the frequency of the signal Sb obtained via the second probe 22 is expressed by Equation 4 shown below.

$$Sd = (A_1 A_2/4)\cos\{2\pi f_s t + \Phi_s + \Delta\Phi\} \quad \text{Equation 4}$$

This signal component Sd is dependent on the signal Sc (Equation 3) output from the filter 33, and is a signal component having the frequency fs of reference signal as a result of the cancelling of the phase fluctuations $\Phi_n(t)$ in the target electric field and the cancelling ($f_s$–$f_{IF}$+$f_{IF}$) of the frequency component dependent on the intermediate frequency $f_{IF}$. Note that the cancelling of the phase fluctuations means that frequency fluctuations are also cancelled.

The signal output from the second multiplier 34 is input into the synchronous detector 35 and, in the synchronous detector 35, only the signal component Sd synchronous with the reference signal from the reference signal generator 31 is extracted. The amplitude A and the phase $\Phi$ of the signal component extracted by the synchronous detector 35 are expressed by Equations 5 and 6, respectively, shown below.

$$A = A_1 A_2 / 4 \quad \text{Equation 5}$$

$$\Phi = \Delta\Phi \quad \text{Equation 6}$$

The amplitude A obtained via the synchronous detector 35 corresponds to a product of the amplitude $A_1$ at the measurement point in the target electric field and the amplitude $A_2$ at the reference point in the target electric field, and the phase $\Phi$ obtained via the synchronous detector 35 indicates the phase $\Delta\Phi$ at the measurement point based on the phase of the reference point. In this manner, the amplitude and phase of the target electric field at a measurement point based on the reference point are measured.

Note that in the description that refers to Equations 1 through 6 shown above, output signals from the first probe 21 and the second probe 22 that are output at the same point in time t are used, but this timing was exemplified for illustrative purposes only; the output signals need not be signals output at the same point in time t. For example, outputs signals from the first probe 21 and the second probe 22 that are output at different points in time may be used so long as they are within a range permitted by the phase fluctuation $\Phi_n(t)$, and the distance between the first probe 21 and the source of the electromagnetic field and distance between the second probe 22 and the source of the electromagnetic field may be different (i.e., the propagation times may be different).

In this way, after measurement of the amplitude and phase at a first measurement point in the target electric field is complete, with the reference point of the second probe 22 still fixed, the first probe 21 is subsequently moved to a second measurement point, at which the amplitude and phase of the target electric field are measured at the second measurement point using the same signal processing. This measurement is repeated for all predetermined measurement points. Such measurement processes (method for measuring an electromagnetic field) are consolidated in the flow chart illustrated in FIG. 2.

Figure 2:
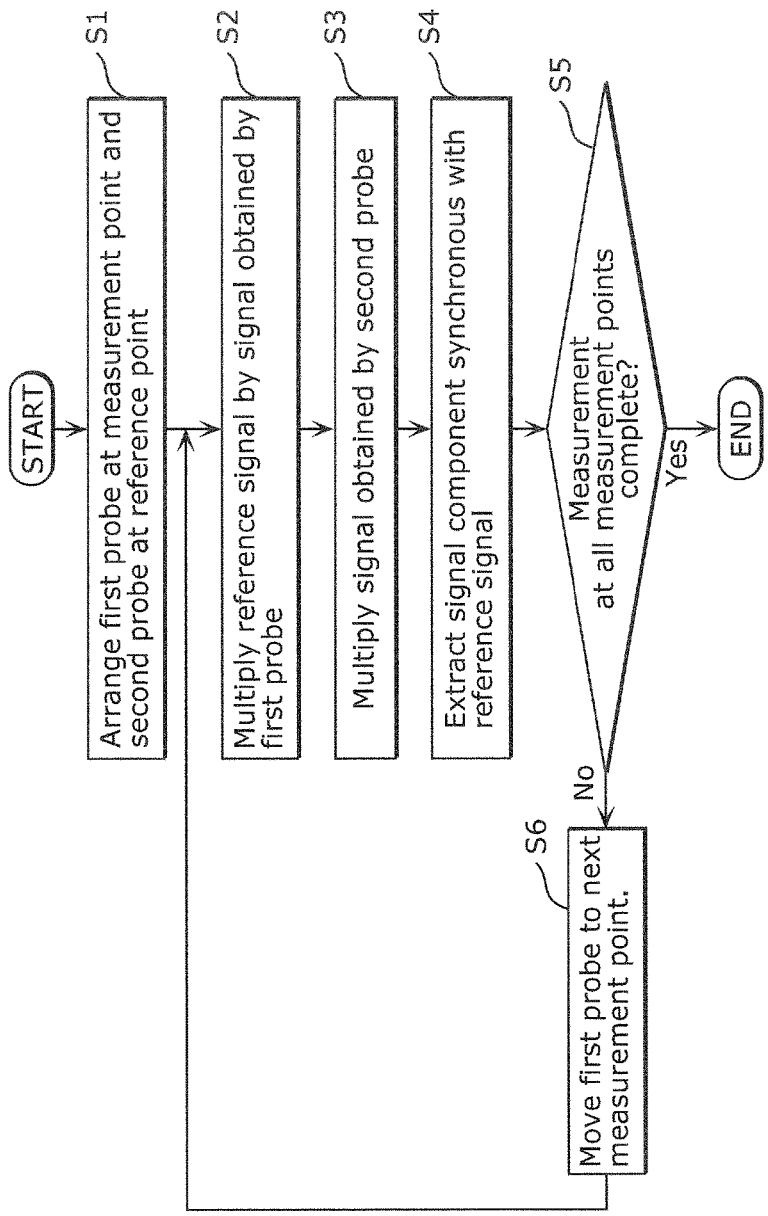
FIG. 2 is a flow chart illustrating processes in a method for measuring an electromagnetic field using the electromagnetic field measurement device according to an embodiment of the present disclosure.

FIG. 2 is a flow chart illustrating processes in the method for measuring an electromagnetic field using the electromagnetic field measurement device 10 according to this embodiment. Here, the principle steps for obtaining a spatial distribution of the electric field are illustrated.

First, the first probe 21 is arranged at a measurement point in the space covered by the target electric field, and the second probe 22 is arranged at a reference point (first arrangement step S1).

Next, the first multiplier 32 multiplies the reference signal generated by the reference signal generator 31 by the signal obtained via the first probe 21 (first multiplication step S2). Note that when it is necessary to convert the signal output by the first probe 21 into a lower frequency (intermediate frequency), the first multiplier 32 performs the multiplication after the frequency of the first frequency converter 23 converts the signal output by the first probe 21 into the intermediate frequency.

Next, the second multiplier 34 multiplies the signal obtained via the second probe 22 by the signal obtained in the first multiplication step S2 (second multiplication step S3). Note that when it is necessary to convert the signal output by the second probe 22 into a lower frequency (intermediate frequency), the second multiplier 34 performs the multiplication after the frequency of the second frequency converter 24 converts the signal output by the second probe 22 into the intermediate frequency. Further, when necessary, the second multiplier 34 performs the multiplication after the filter 33 selects, from the signal output from the first multiplier 32, a signal component whose frequency is equivalent to the sum or difference of the intermediate frequency and the reference signal frequency.

Next, the synchronous detector 35 extracts, from the signal obtained in the second multiplication step S3, a signal component synchronous with the reference signal generated by the reference signal generator 31 (synchronous detection step S4). With this, the amplitude and phase of the target electric field at the measurement point are obtained.

Then, it is determined whether measurement at all of the predetermined measurement points is complete or not (S5), and when determined not to be complete (no in S5), while the second probe 22 is fixed at the reference point, the first probe 21 is moved so as to be arranged at the next measurement point (second or subsequent arrangement step S6), and the same signal processing is repeated (S2 through S4). On the other hand, when measurement at all of the predetermined measurement points is determined to be complete (yes in S5), measurement ends.

In this way, in the arrangement steps (S1, S6), while the second probe 22 is fixed in place in the space covered by the target electric field, the first probe 21 is sequentially moved to and arranged at a plurality of measurement points in the space (i.e., is spatially scanned), and the first multiplication step S2, the second multiplication step S3, and the synchronous detection step S4 are executed each time the first probe 21 is arranged a measurement point in the arrangement step S6. With this, the electromagnetic field measurement device 10 obtains a spatial distribution of the target electric field.

Note that when probes used for magnetic field measurement (magnetic field probes) are used for the first probe 21 and the second probe 22, a spatial distribution of the target magnetic field is obtained based on the same principals.

As described above, according to the electromagnetic field measurement device 10 and the method for measuring an electromagnetic field according to this embodiment, using two probes arranged in the target electromagnetic field, in the noise cancellation unit 30, phase and frequency fluctuations in the electric field or magnetic field in the target electromagnetic field are cancelled. Accordingly, even when there are changes in the frequency of the electric field or magnetic field in the target electromagnetic field, it is possible to stably and precisely measure the spatial distribution of the electric field or magnetic field without having to synchronize the system to be measured and the measuring system. As a result, the radiation pattern from the integrated circuit of the signal generation source and radiating body such as an antenna (on-chip antenna) can be measured without having to synchronize the system to be measured and the measuring system.

Principle Verification and Experiments

Next, an experiment that was performed to confirm whether the noise cancellation unit 30 of the electromagnetic field measurement device 10 according to the above-described embodiment operates regardless of the detection unit 20 will be described.

Figure 3:
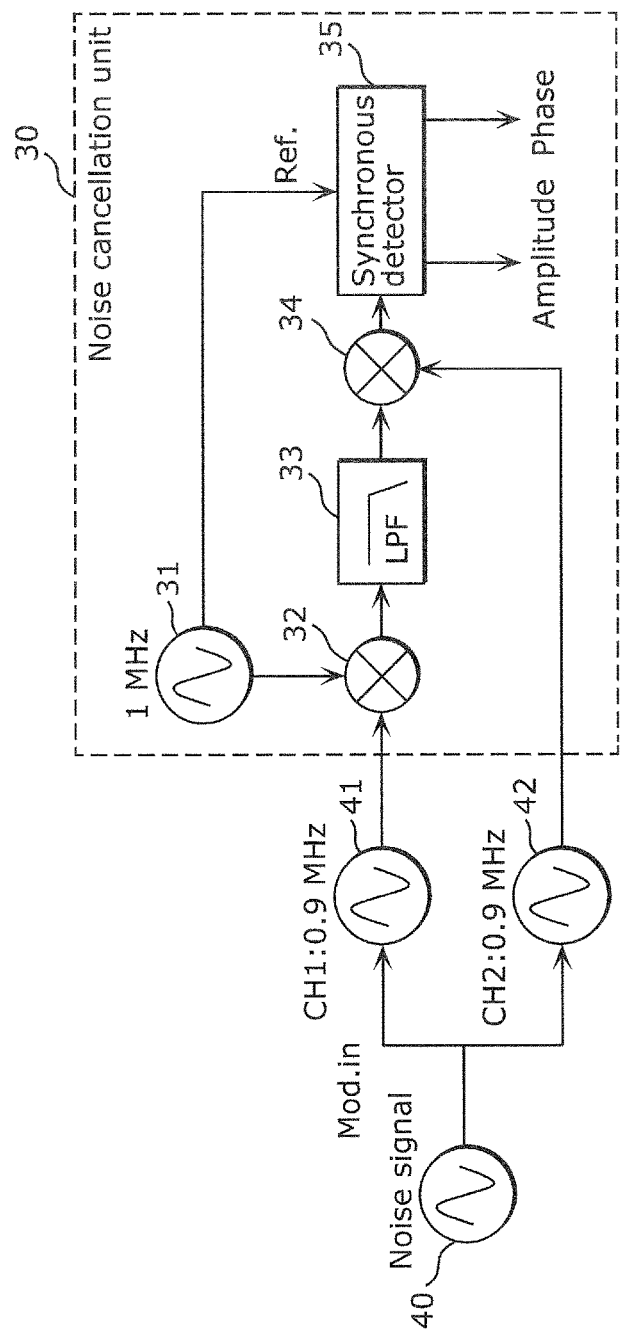
FIG. 3 is a block diagram illustrating a configuration of an experiment system for checking the operation of an electromagnetic field measurement device according to an embodiment of the present disclosure.

FIG. 3 is a block diagram illustrating a configuration of the experiment system. As illustrated in FIG. 3, the signals from the first probe 21 and the second probe 22 are replaced by dual channel oscillators 41 and 42. The frequency of each is 0.9 MHz. The phases of the signals are modulated using an external noise source 40. In other words, a 0.9 MHz signal whose phase was been modulated by noise was input into the noise cancellation unit 30 (the first multiplier 32 and the second multiplier 34), and the detection signal obtained via the synchronous detector 35 was checked (i.e., the amplitude and phase of the 0.9 MHz signal was checked).

Figure 4A:
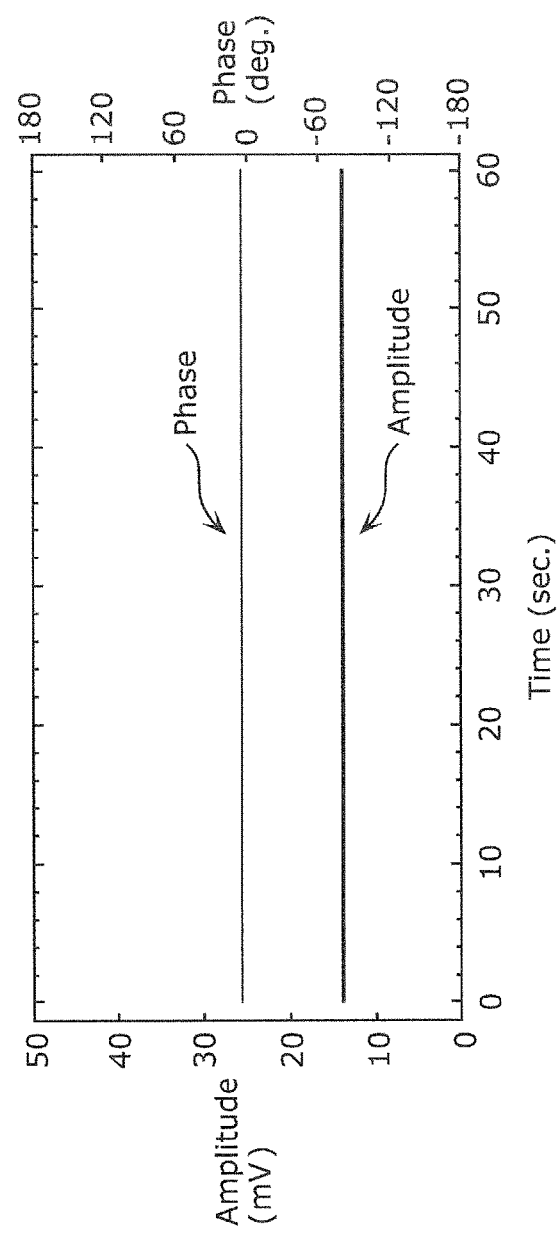
FIG. 4A illustrates the waveform of a detection signal obtained by the experiment system illustrated in FIG. 3.

FIG. 4A illustrates the waveform (temporal changes in the detected amplitude and phase) of the detection signal obtained via the noise cancellation unit 30 according to the present disclosure. FIG. 4B illustrates the waveform (temporal changes in the detected amplitude and phase) of the detection signal obtained by signal processing according to conventional techniques. In both FIG. 4A and FIG. 4B, time is represented on the horizontal axis, amplitude (mV) is represented on the left vertical axis, and phase (deg.) is represented on the right vertical axis. As can be seen by comparing FIG. 4A and FIG. 4B, according to conventional techniques, phase noise is superimposed on the detection signal (FIG. 4B), but with the noise cancellation unit 30 according to the present disclosure, noise components are cancelled (FIG. 4A).

Figure 5:
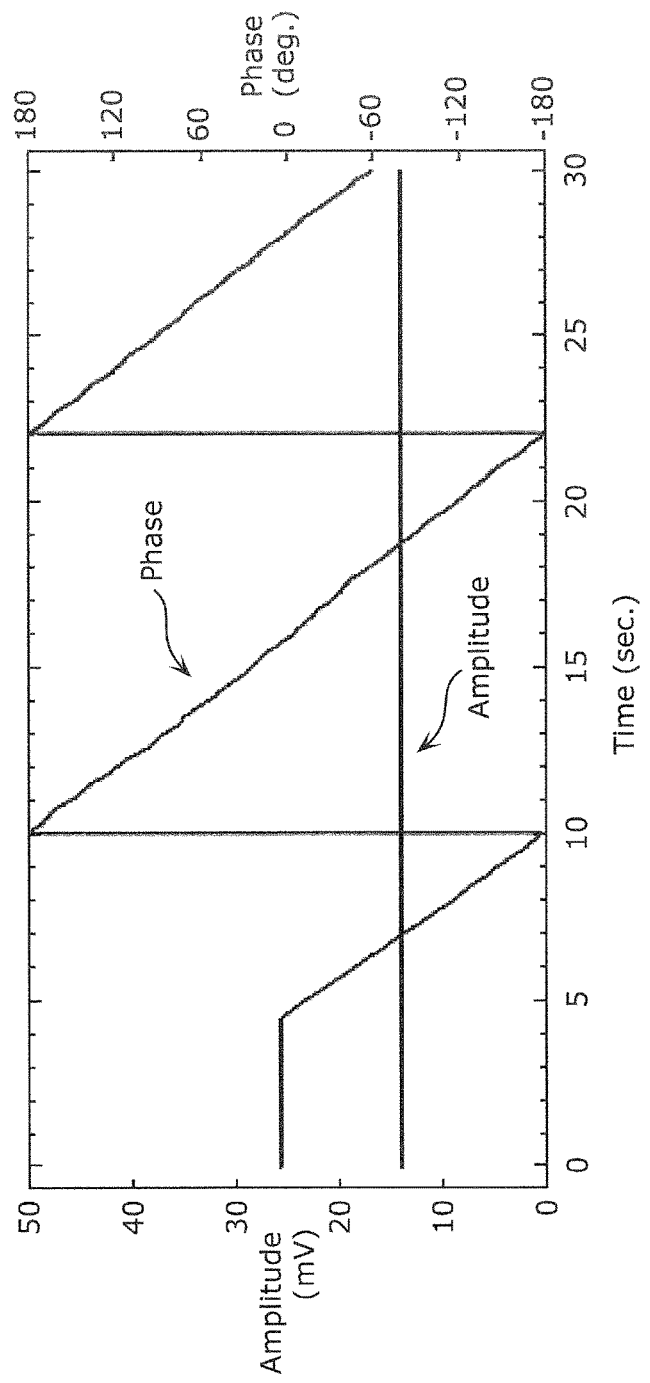
FIG. 5 illustrates the waveform of a detection signal obtained when the phase of a signal output by one of the two oscillators is changed into a linear waveform with respect to time in the experiment system illustrated in FIG. 3.

FIG. 5 illustrates the waveform of a detection signal obtained when the phase of a signal output by one of the oscillators 41 and 42 is changed into a linear waveform with respect to time in the experiment system illustrated in FIG. 3. Just like in FIG. 4A and FIG. 4B, time is represented on the horizontal axis, amplitude (mV) is represented on the left vertical axis, and phase (deg.) is represented on the right vertical axis. In this experiment, a mock-up in which one of the first probe 21 and the second probe 22 was fixed at a single point in a space, and the other was scanned across the space to measure of the spatial distribution of the phase in the target electric field. As can be seen from FIG. 5, measurement was performed in a state in which the relative phase between both signals from the oscillators 41 and 42, which are signal sources that introduce phase noise, can-celled out the phase noise.

Other Embodiments

As the above-described experiment validates, the electromagnetic field measurement device according to the present disclosure is not dependent on the type of detection unit or the detection method used.

Figure 6:
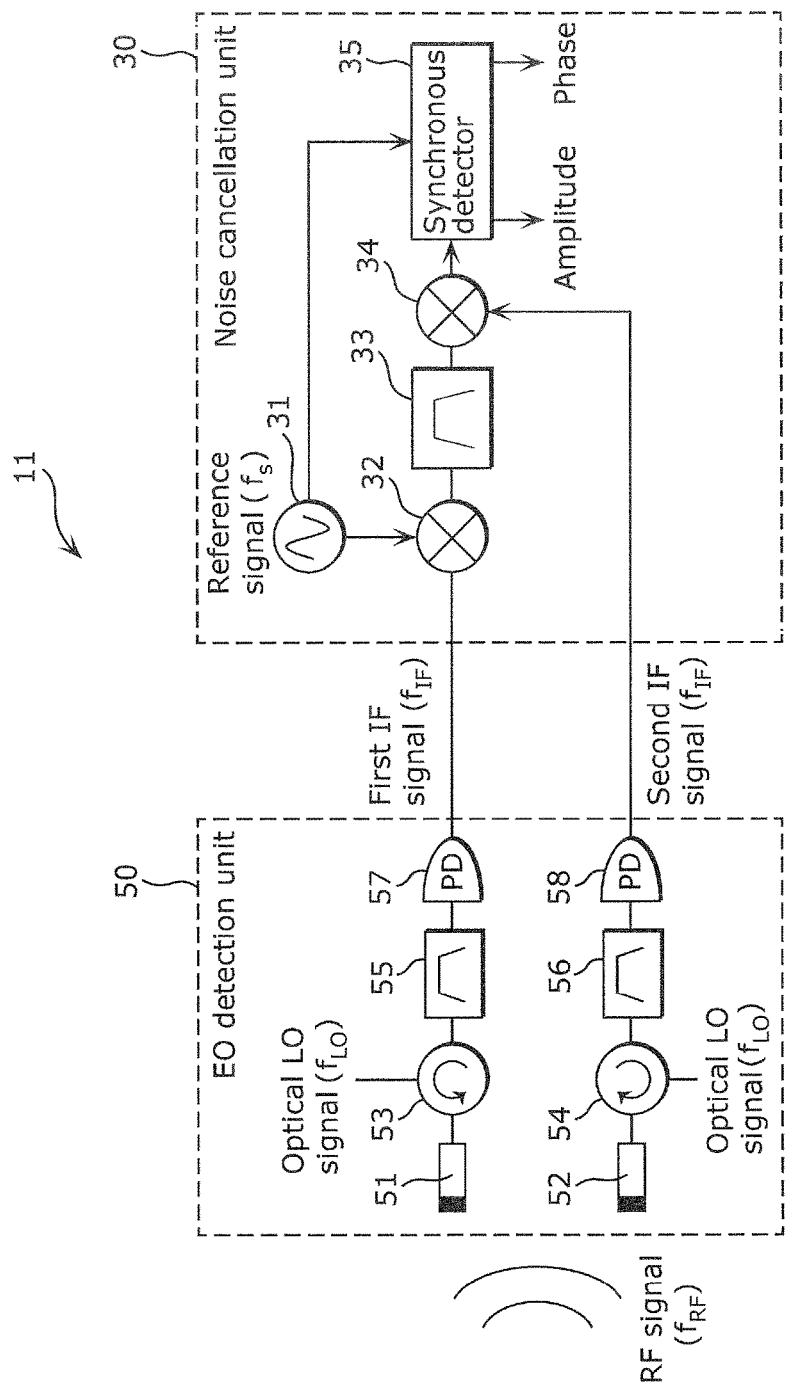
FIG. 6 is a block diagram illustrating a configuration of an electromagnetic field measurement device according to Variation 1 of an embodiment of the present disclosure.

FIG. 6 is a block diagram illustrating a configuration of an electromagnetic field measurement device 11 according to Variation 1 of the above-described embodiment. The electromagnetic field measurement device 11 is equivalent to a configuration achieved by replacing the detection unit 20 in the electromagnetic field measurement device 10 according to the above-described embodiment with an electro-optic (EO) detection unit 50.

The EO detection unit 50 is a processing unit for detecting a target electric field using two probes, and includes a first EO probe 51, a second EO probe 52, a first optical circulator 53, a second optical circulator 54, a first optical filter 55, a second optical filter 56, a first optical detector 57, and a second optical detector 58. The first EO probe 51 and the second EO probe 52 are electro-optic probes that output optical signals (RF signals) dependent on the amplitude and phase of the target electric field. The first optical circulator 53 and the second optical circulator 54 change the direction of travel of light. The first optical circulator 53 emits, to the first EO probe 51, an optical LO signal incident from a light source, and the second optical circulator 54 emits, to the second EO probe 52, an optical LO signal incident from a light source. The optical signals incident on the first EO probe 51 and the second EO probe 52 are output to the first optical filter 55 and the second optical filter 56. For example, an optical LO signal including optical signals having the frequencies f1 and f2 (where $f_{RF}<f2-f1$ or $f_{RF}>f2-f1$ is satisfied) is incident on the first optical circulator 53 and output to the first EO probe 51. In the first EO probe 51, through interaction between the optical signal having the frequency $f_{RF}$ (target electric field signal) and the optical signal from the first optical circulator 53, a sideband component of the frequency (f1+$f_{RF}$) and the frequency (f1−$f_{RF}$), and a sideband component of the frequency (f2+$f_{RF}$) and the frequency (f2−$f_{RF}$) are generated. The same applies to the second optical circulator 54 and the second EO probe 52.

The first optical filter 55 and the second optical filter 56 are bandpass filters that select, from the optical signal output from the first EO probe 51 via the first optical circulator 53 and the optical signal output from the second EO probe 52 via the second optical circulator 54, respectively, one sideband optical signal and one optical signal included in the optical LO signal (for example, the signal component of the frequency (f1+$f_{RF}$) and the frequency f2).

The first optical detector 57 and the second optical detector 58 are photodiodes that convert the optical signals output from the first optical filter 55 and the second optical filter 56, respectively, into electric signals (for example, a signal component of the frequency (|f2−f1−$f_{RF}$|)), and output the results of the conversions as the first IF signal and the second IF signal, respectively.

The first optical circulator 53, the first optical filter 55, and the first optical detector 57 correspond to a first frequency converter that converts the optical signal output from the first EO probe 51 into an electric signal having an intermediate frequency lower than the frequency of the optical signal. Similarly, the second optical circulator 54, the second optical filter 56, and the second optical detector 58 correspond to a second frequency converter that converts the optical signal output from the second EO probe 52 into an electric signal having an intermediate frequency lower than the frequency of the optical signal.

An experiment was performed to measure a radiation electric field using the electromagnetic field measurement device 11 according to this variation and configured as described above.

Since the frequency $f_{RF}$ of the RF signal received by the first EO probe 51 and the second EO probe 52 is approximately 75.598 GHz, and the difference (f2−f1) between the two optical signals included in the optical LO signal is approximately 75.6 GHz, the frequency (f2−f1−$f_{RF}$) of the first IF signal is approximately 2 MHz. However, since the RF signal and the optical LO signal are not synchronous, the frequency of the first IF signal fluctuates. Since the frequency of the reference signal from the reference signal generator 31 was set at 1.8 MHz, signal components of approximately 3.8 MHz and 0.2 MHz are obtained as a result of the frequency conversion by the first multiplier 32. Signals of 1.8 MHz and 2.2 MHz are obtained by the filter 33 selecting the signal component of 0.2 MHz and the second multiplier 34 mixing the selected signal component and the second IF signal (approximately 2 MHz signal) obtained via the second EO probe 52. Upon measuring the amplitude and phase of the 1.8 MHz signal via the synchronous detector 35, the measured amplitude is equivalent to a value proportional to the product of the amplitudes of the RF signals obtained via the first EO probe 51 and the second EO probe 52, and the measured phase is equivalent to the difference between the phases of the RF signals obtained via the first EO probe 51 and the second EO probe 52.

Figure 7:
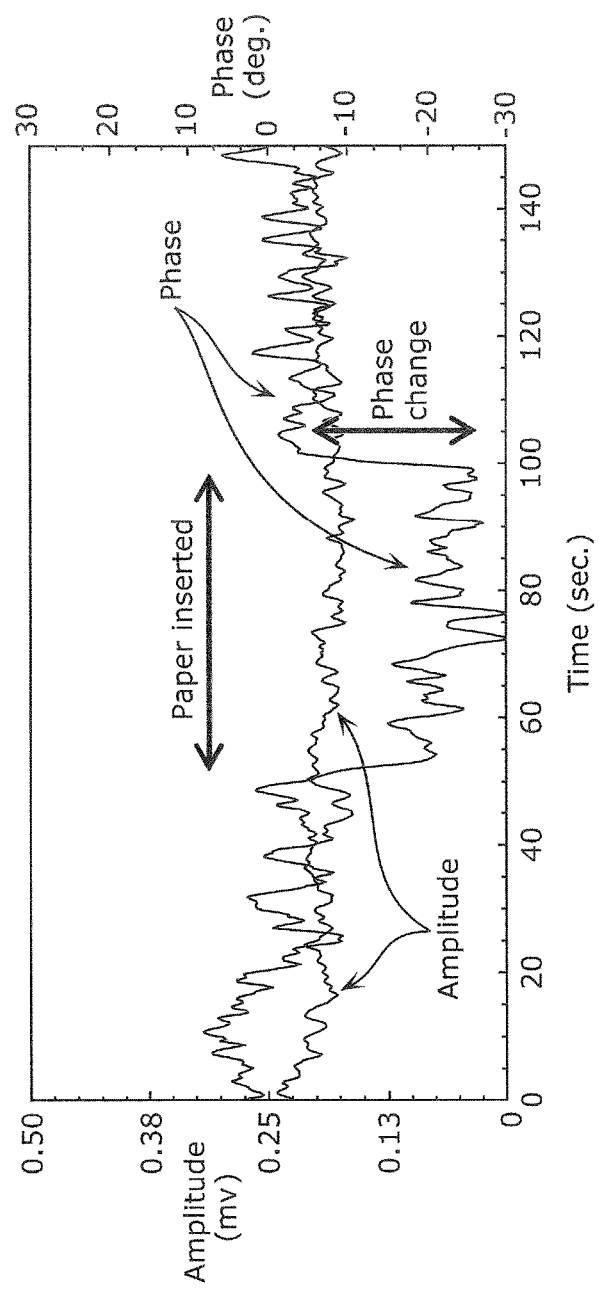
FIG. 7 illustrates the results of an experiment using the electromagnetic field measurement device according to Variation 1 of an embodiment of the present disclosure.

FIG. 7 illustrates the results of the experiment using the electromagnetic field measurement device 11 according to this variation. Here, FIG. 7 illustrates detection signals obtained via the synchronous detector 35 when the difference in phase was applied between both RF signals detected by the first EO probe 51 and the second EO probe 52 by placing plain paper directly in front of the first EO probe 51. Just like in FIG. 4A and FIG. 4B, time is represented on the horizontal axis, amplitude (mV) is represented on the left vertical axis, and phase (deg.) is represented on the right vertical axis.

As illustrated in FIG. 7, the amount of shift in phase resulting from the insertion of the plain paper matches the value calculated from the refractive index of the plain paper and the frequency (approximately 75 GHz) of the RF signals, and the difference in phase is measured while phase noise is cancelled by the electromagnetic field measurement device 11 according to this variation.

As described above, with the electromagnetic field measurement device 11 according to this variation, using two probes arranged in the target electromagnetic field, phase and frequency fluctuations in the target electric field are cancelled by the noise cancellation unit 30. Accordingly, even when there are changes in the frequency of the target electric field, it is possible to stably and precisely measure the spatial distribution of the electric field without having to synchronize the system to be measured and the measuring system.

Note that with the electromagnetic field measurement device according to the above-described embodiment and Variation 1, noise is cancelled by analog signal processing, but noise may be cancelled by digital signal processing.

Figure 8:
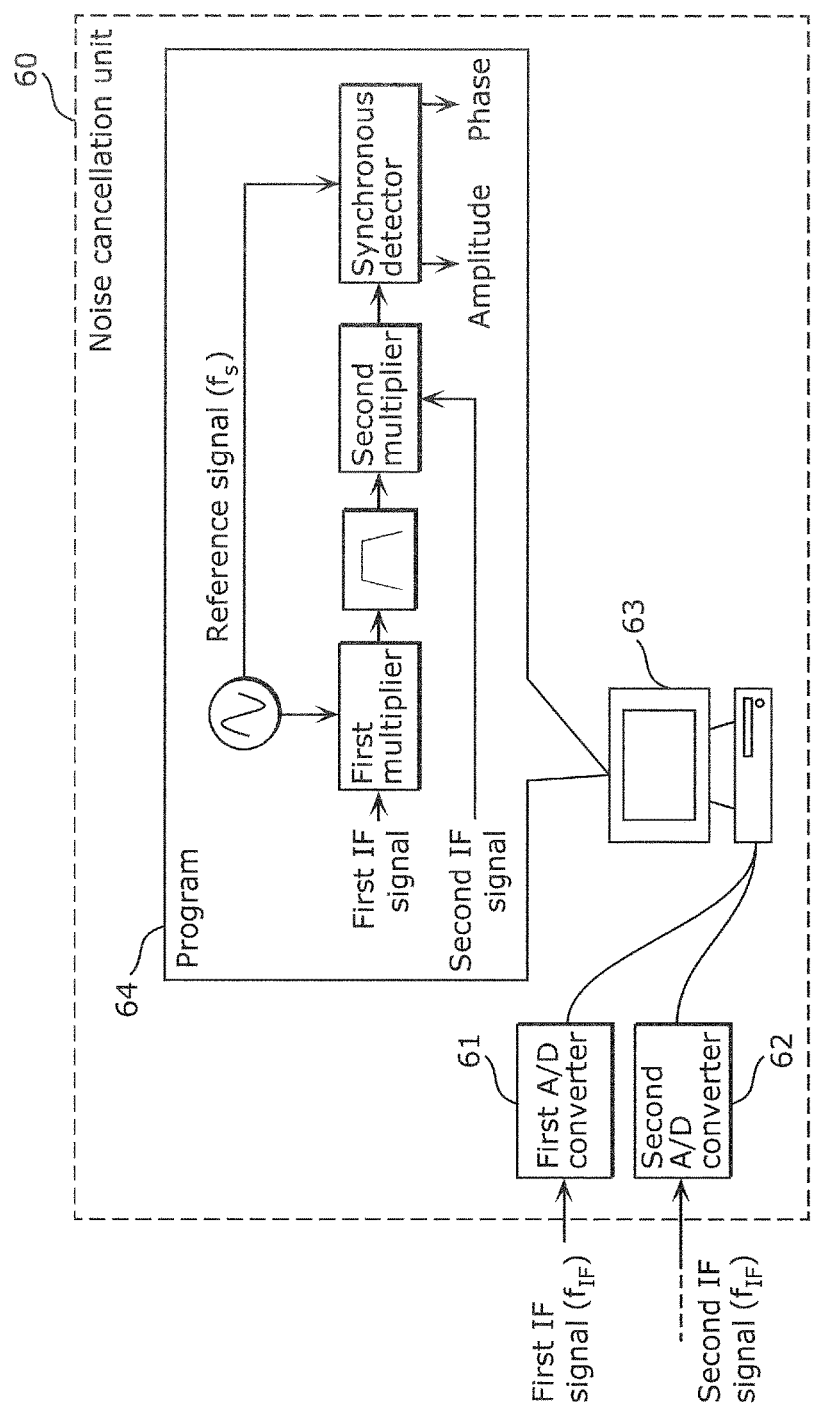
FIG. 8 is a block diagram illustrating a configuration of a noise cancellation unit included in an electromagnetic field measurement device according to Variation 2 of an embodiment according to the present disclosure.

FIG. 8 is a block diagram illustrating a configuration of a noise cancellation unit 60 included in an electromagnetic field measurement device according to Variation 2 of the above-described embodiment. Note that the detection unit included in the electromagnetic field measurement device according to this variation is the same as the detection unit according to the above-described embodiment and Variation 1.

The noise cancellation unit 60 is a processing unit for cancelling phase and frequency fluctuations in the electric field or magnetic field in the target electromagnetic field by using digital signal processing. The noise cancellation unit 60 includes a first A/D converter 61, a second A/D converter 62, and a computer device 63.

The first A/D converter 61 converts the first IF signal obtained via, for example, the first probe 21 according to the above-described embodiment into a digital value.

The second A/D converter 62 converts the second IF signal obtained via, for example, the second probe 22 according to the above-described embodiment into a digital value.

The computer device 63 is a device that processes the digital signals output from the first A/D converter 61 and the second A/D converter 62, and executes the method for measuring an electromagnetic field illustrated in FIG. 2 in accordance with a program 64 stored internally. The method for measuring an electromagnetic field includes at least a first multiplication step S2 of multiplying the reference signal by the digital signal output from the first A/D converter 61, a second multiplication step S3 of multiplying the signal output from the second A/D converter 62 by the signal obtained in the first multiplication step S2, and a synchronous detection step S4 of extracting, from the signal obtained in the second multiplication step S3, a signal component that is synchronous with the reference signal. More specifically, the computer device 63 executes digital signal processing equivalent to the signal processing performed by the noise cancellation unit 30 according to the embodiment.

Figure 9:
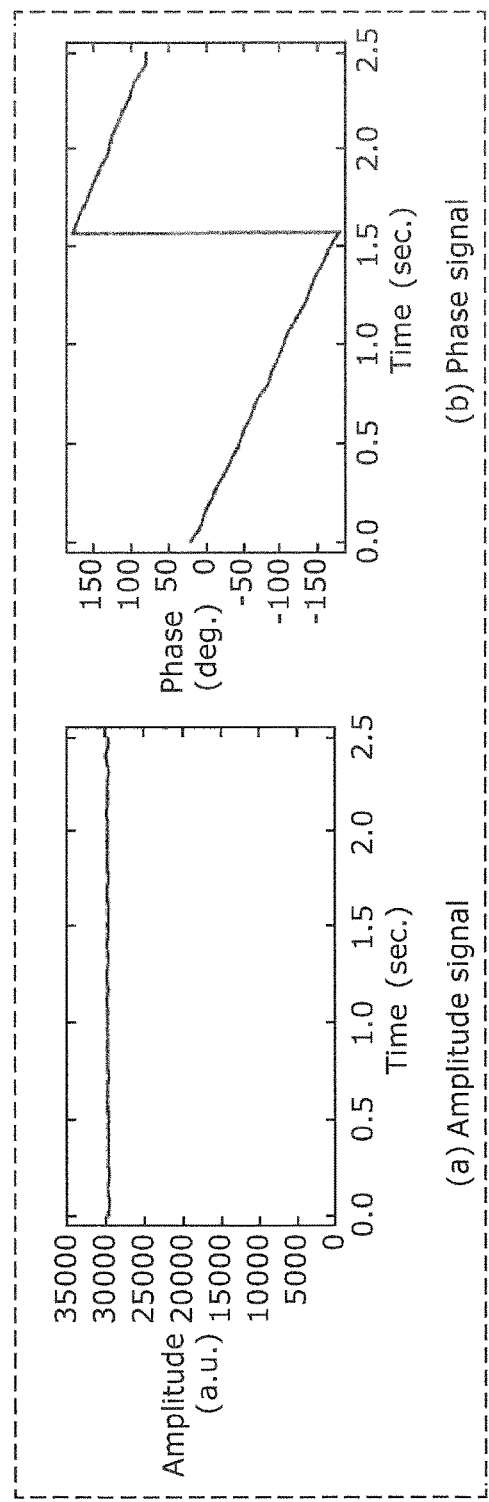
FIG. 9 illustrates the results of an experiment using the electromagnetic field measurement device according to Variation 2 of an embodiment of the present disclosure.

FIG. 9 illustrates the results of an experiment using the electromagnetic field measurement device according to this variation. FIG. 9 illustrates detection signals (the amplitude of the target electric field ((a) in FIG. 9) and the phase of the target electric field ((b) in FIG. 9)) resulting from an experiment in which the first IF signal and the second IF signal were superimposed with the same phase noise and the phase of the second IF signal was shifted to a linear waveform over time. Just like in FIG. 4A and FIG. 4B, time is represented on the horizontal axis, amplitude (mV) is represented on the left vertical axis, and phase (deg.) is represented on the right vertical axis.

As can be seen from FIG. 9, with the electromagnetic field measurement device according to this variation, which cancels noise via digital signal processing, the same phase noise that was superimposed on the first IF signal and the second IF signal is cancelled, and changes over time in relative difference in phase between the first IF signal and the second IF signal has been successfully measured.

As described above, with the electromagnetic field measurement device according to this variation, using two probes arranged in the target electromagnetic field, in the noise cancellation unit 60 that employs digital signal processing, phase and frequency fluctuations in the electric field or magnetic field in the target electromagnetic field are cancelled. Accordingly, even when there are changes in the frequency of the electric field or magnetic field in the target electromagnetic field, it is possible to stably and precisely measure the spatial distribution of the electric field or magnetic field without having to synchronize the system to be measured and the measuring system.

Note that in the above-described embodiment, the second probe (reference probe) is fixed at single point in the space and the first probe (measurement probe) is scanned in the space. However, with this scanning method, depending on the physical shape of the target object to be measured or the shape of the radiation pattern of the target electromagnetic wave to be measured, it may be difficult to scan the space using the measurement probe while the reference probe is fixed in a single point in the space. Accordingly, in order to overcome this problem, as a probe scanning method, the two probes may be moved together. Note that "moving n probes together" means moving the n probes while the relative positional relationship between the n probes is fixed. Hereinafter, a scanning method involving moving two probes together will be described.

Figure 10:
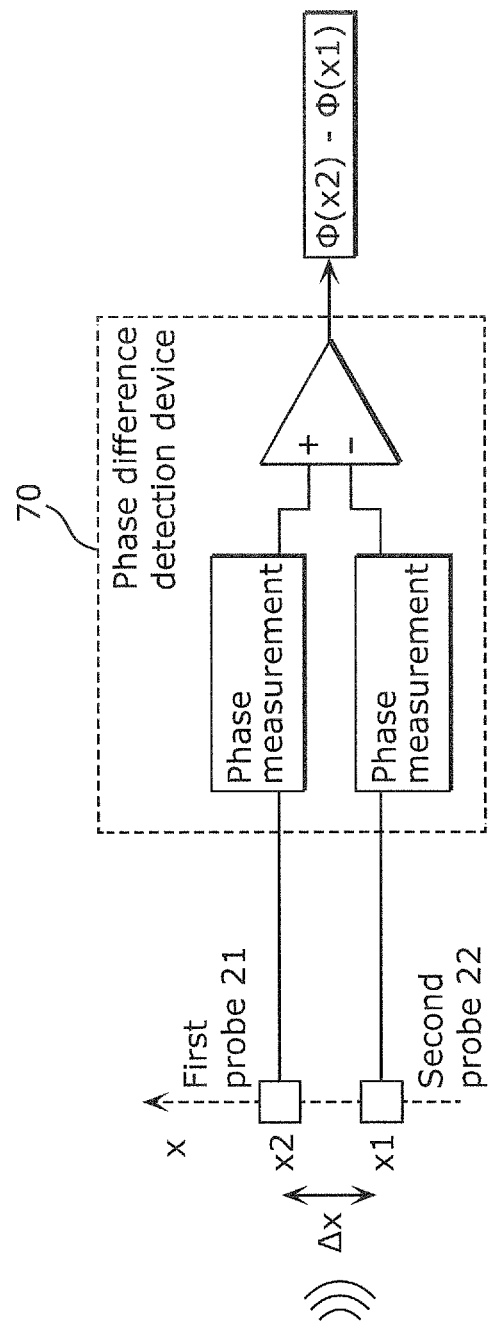
FIG. 10 illustrates a method for measuring an electromagnetic field by scanning a space by moving two probes together.

FIG. 10 illustrates a method for measuring an electromagnetic field by scanning a space by moving two probes together. Here, the principle of a one-dimensional (x axis) phase distribution measurement is shown. Note that since the amplitude distribution is easily obtained from signals measured by the probes, description thereof will be omitted.

As illustrated in FIG. 10, the phase of the electromagnetic field at positions whose coordinates only change by Δx coordinates on the x axis (Δx=x2−x1, where the coordinate for the first probe 21 is x2 and the coordinate for the second probe 22 is x1) is measured by the first probe 21 and the second probe 22 using the phase difference detection device 70. Note that the phase difference detection device 70 is a device that detects the difference in phase between two signals, and is, for example, the noise cancellation unit 30 according to the above-described embodiment.

A reference needs to be established in order to determine the phase at each of the positions. Here, the reference will be a local signal of the measuring system. The local signal of the measuring system and the signal to be measured are not in-phase. Accordingly, the phases measured by the probes are superimposed with fluctuation, but that fluctuation is common-mode in the first probe 21 and the second probe 22. Accordingly, when the difference in phase at the positions of both probes is obtained, the common phase fluctuations are cancelled, and as illustrated in FIG. 10, a difference in phase $\Delta\Phi_{21}$ (=$\Phi$(x2)–$\Phi$(x1)) between the signals measured at coordinate x2 and coordinate x1 is detected.

Here, in the positioning stage, the first probe 21 and the second probe 22 are moved together by a distance of $\Delta$x along the x axis. In other words, the coordinate of first probe 21 becomes x3 (=x2+$\Delta$x) and the coordinate of second probe 22 becomes x2. The phase measured after the move becomes $\Delta\Phi_{32}$ (=$\Phi$(x3)–$\Phi$(x2)). The relative phase between $\Phi$(x1) and $\Phi$(x2) is calculated from these two values, namely the measurement value before the move and the measurement value after the move. By repeating these steps, a one-dimensional relative phase spatial distribution of the electromagnetic field is revealed.

Note that a two-dimensional probe can be achieved by, for example, arranging a third probe at a position offset by a distance of $\Delta$y on the y axis (perpendicular to the drawing sheet) from the second probe 22 illustrated in FIG. 10. By scanning these three probes by moving the three probes together, from the positioning stage (XY stage), distance $\Delta$x at a time and distance $\Delta$y at a time in the xy plane, it is possible to measure an xy plane distribution of the electromagnetic field based on the above-described principle. Similarly, a three-dimensional probe can be achieved by arranging a fourth probe at a position offset by a distance of $\Delta$z on the z axis from the xy plane relative to the two-dimensional probe. Then, by scanning these four probes by moving the four probes together, from the positioning stage (XYZ stage), distance $\Delta$x at a time, distance $\Delta$y at a time, and distance $\Delta$z at a time, it is possible to measure a three-dimensional distribution of the electromagnetic field based on the above-described principle.

In this way, with the method for measuring an electromagnetic field using the scanning method illustrated in FIG. 10 involving moving the two probes together, in the arrangement step S1 illustrated in FIG. 2, while the distance between the first probe 21 and the second probe 22 is fixed, the first probe 21 and the second probe 22 are arranged at a plurality of measurement points in the space by sequentially moving the first probe 21 and the second probe 22 together to the plurality of measurement points. Moreover, the first multiplication step S2, the second multiplication step S3, and the synchronous detection step S4 illustrated in FIG. 2 are performed each time the first probe 21 and the second probe 22 are arranged at a measurement point in the arrangement step S1. More specifically, in the arrangement step S1, the first probe 21 and the second probe 22 are moved together such that the position of one of the first probe 21 and the second probe 22 at a current measurement point and a position of the other of the first probe 21 and the second probe 22 at the next measurement point are the same point.

This scanning method involving moving a plurality of probes together overcomes the problem pertaining to the scanning method involving fixing the second probe (reference probe) at one point in the space. In other words, with the method involving fixing the reference probe at one point in the space and measuring a relative phase distribution relative to the phase at that point, there is a problem that measurement may not be possible depending on the object to be measured or the distribution of the radiation field, but this problem is overcome by the above-described method. Accordingly, with the method of scanning a plurality of probes together, measurement of a spatial distribution of the phase of a radiation field radiating from, for example, a self-oscillation device exhibiting frequency fluctuation is possible in an arbitrary plane.

Note that the first probe 21 and the second probe 22 according to the above-described embodiment are used in FIG. 10, but the types of probes are not limited to this example; a different type of probe, such as the EO probe described above in Variation 1, may be used. Likewise, the phase difference detection device 70 illustrated in FIG. 10 is not limited to the noise cancellation unit 30 according to the above-described embodiment; any device that detects the difference in phase between two signals may be used.

Figure 11:
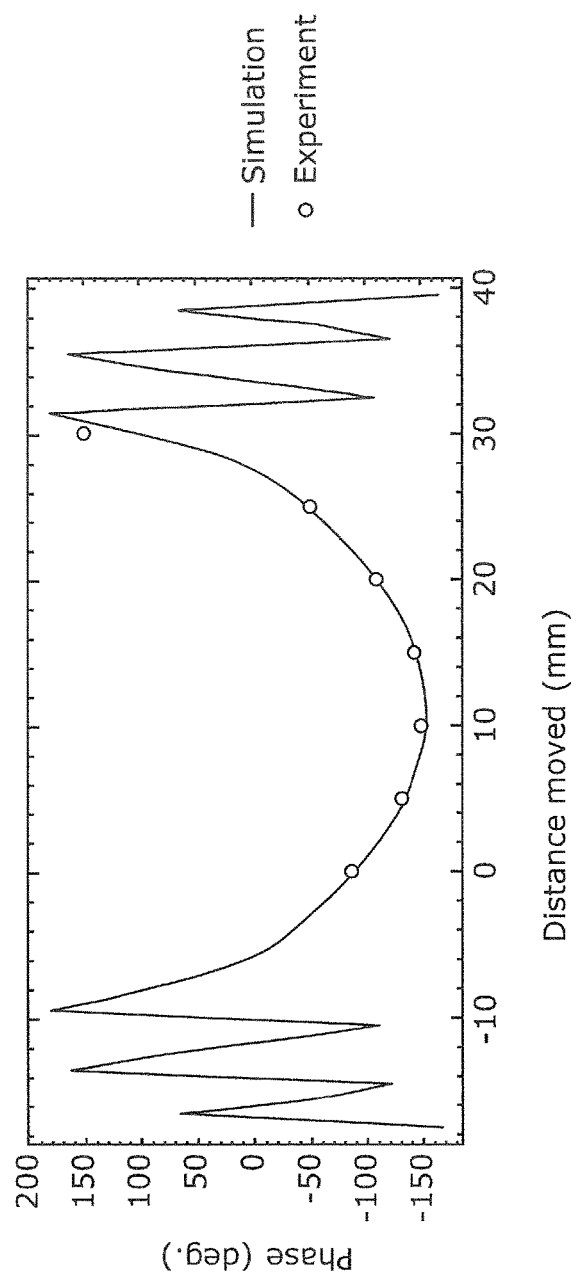
FIG. 11 illustrates measurement values and a simulation result obtained by an experiment using the method of scanning two probes together illustrated in FIG. 10.

FIG. 11 illustrates measurement values (plotted dots) and a simulation result (solid line) obtained by an experiment using the method of scanning two probes together illustrated in FIG. 10. The horizontal axis indicates distance moved by the two probes (positions on the x axis), and the vertical axis indicates phase at the distances moved.

This experiment was performed using the same devices as the experiment described in Variation 1 of the embodiment and under the same conditions as well. In other words, the EO detection unit 50 and the noise cancellation unit 30 illustrated in FIG. 6 were used as the phase difference detection device 70. Moreover, the frequency $f_{RF}$ of the RF optical signal was set to approximately 75.598 GHz, difference in frequency between the two optical signals included in the optical LO signal was set to approximately 75.6 GHz, and the frequency of the reference signal was set to 1.8 MHz. Moreover, the difference in phase between the RF signals at the positions of the first EO probe 51 (measurement probe) and the second EO probe 52 (reference probe) was obtained by measuring the phase of the 1.8 MHz signal output from the noise cancellation unit 30.

Note that the distance $\Delta$x between the first EO probe 51 (measurement probe) and the second EO probe 52 (reference probe) was 5 mm, and these two probes were fixed together in the positioning stage and moved along the x axis.

As can be seen from FIG. 11, the measurement value of the phase distribution obtained at the 5 mm distance in this experiment closely matches the simulation result.

In the experiment illustrated in FIG. 11, the spatial distribution of the phase is measured by moving the measurement probe and the reference probe together by distance $\Delta$x equal to the distance between the probes, but a phase distribution of a higher resolution space may be obtained by imposing a condition of performing interpolation and obtaining N sets of data by offsetting the measurement start point slightly (by a distance less than $\Delta$x) to, for example, smooth the data.

Figure 12:
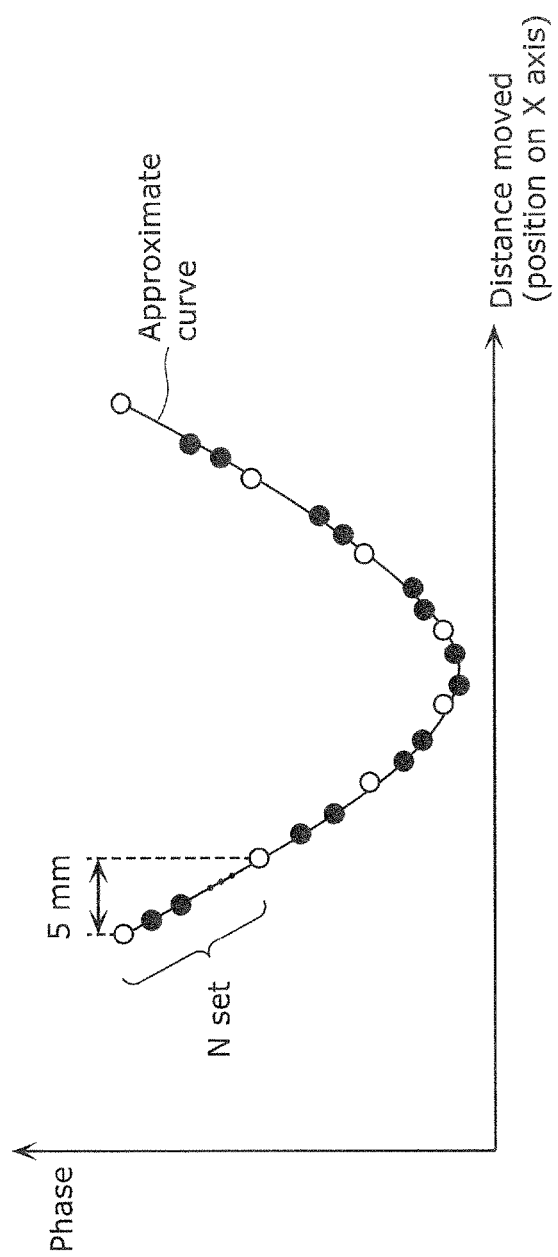
FIG. 12 illustrates a method for measuring an electromagnetic field involving scanning a space by moving the measurement probe and the reference probe together while offsetting the movement, together, by a distance less than the distance Δx between the probes.

FIG. 12 illustrates a method for measuring an electromagnetic field involving scanning a space by moving the measurement probe and the reference probe together while offsetting the movement, by a distance less than the distance $\Delta$x between the probes. FIG. 12 illustrates one example of a phase distribution obtained by, in the distance $\Delta$x between the probes, obtaining N sets of data and smoothing the data (plotting the data on an approximate curve).

Figure 13:
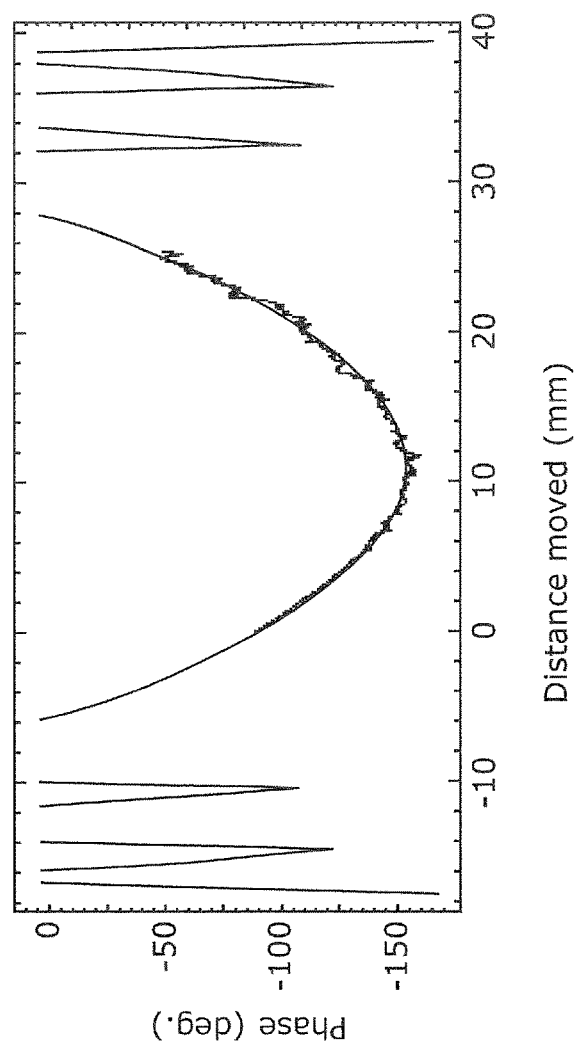
FIG. 13 illustrates measurement values and a simulation result obtained by an experiment using the electromagnetic field measurement method illustrated in FIG. 12.

FIG. 13 illustrates measurement values (plotted dots) and a simulation result (solid line) obtained by an experiment using the method illustrated in FIG. 12 of scanning two probes together, using a positioning stage, by moving the two probes together at intervals shorter than the distance between the two probes.

When two probes distanced apart by a distance Δx of 5 mm are moved together, N data sets for the 5 mm distance can be obtained. Accordingly, in this experiment, since the probes are moved together at 0.5 mm intervals, N=100. The phase relationship between the data sets is indefinite, but since each of the data sets is a measurement of the same phase distribution, by determining the amount of indefiniteness of the initial phase such that the spatial distributions of the phase created by the data sets are smoothly connected, measurement of the phase distribution with an increased spatial resolution illustrated in FIG. 13 is possible. Note that the data from the experiment illustrated in FIG. 13 was obtained using EO probes set to the inter-probe distance Δx of 5 mm used to obtain the data illustrated in FIG. 11. As can be seen from FIG. 13, the measurement values of the phase distribution obtained at the 0.5 mm intervals in this experiment closely matches the simulation result.

In this way, with the electromagnetic field measurement method employing the probe scanning method illustrated in FIG. 12 and FIG. 13, in the arrangement step S1 illustrated in FIG. 2, the first probe and the second probe are moved together such that one of the first probe and the second probe is sequentially arranged at a plurality of positions obtained by dividing the distance between the first probe and the second probe at a predetermined point in time. With this, a phase distribution of a higher resolution space is measured by imposing a condition of performing interpolation by, for example, smoothly connecting the phases obtained at each of the plurality of points.

Next, as one example of an application of the electromagnetic field measurement device according to the above-described embodiment, a phase imaging device that uses millimeter waves to visualize the inside of an object without damaging the object will be described.

Figure 14:
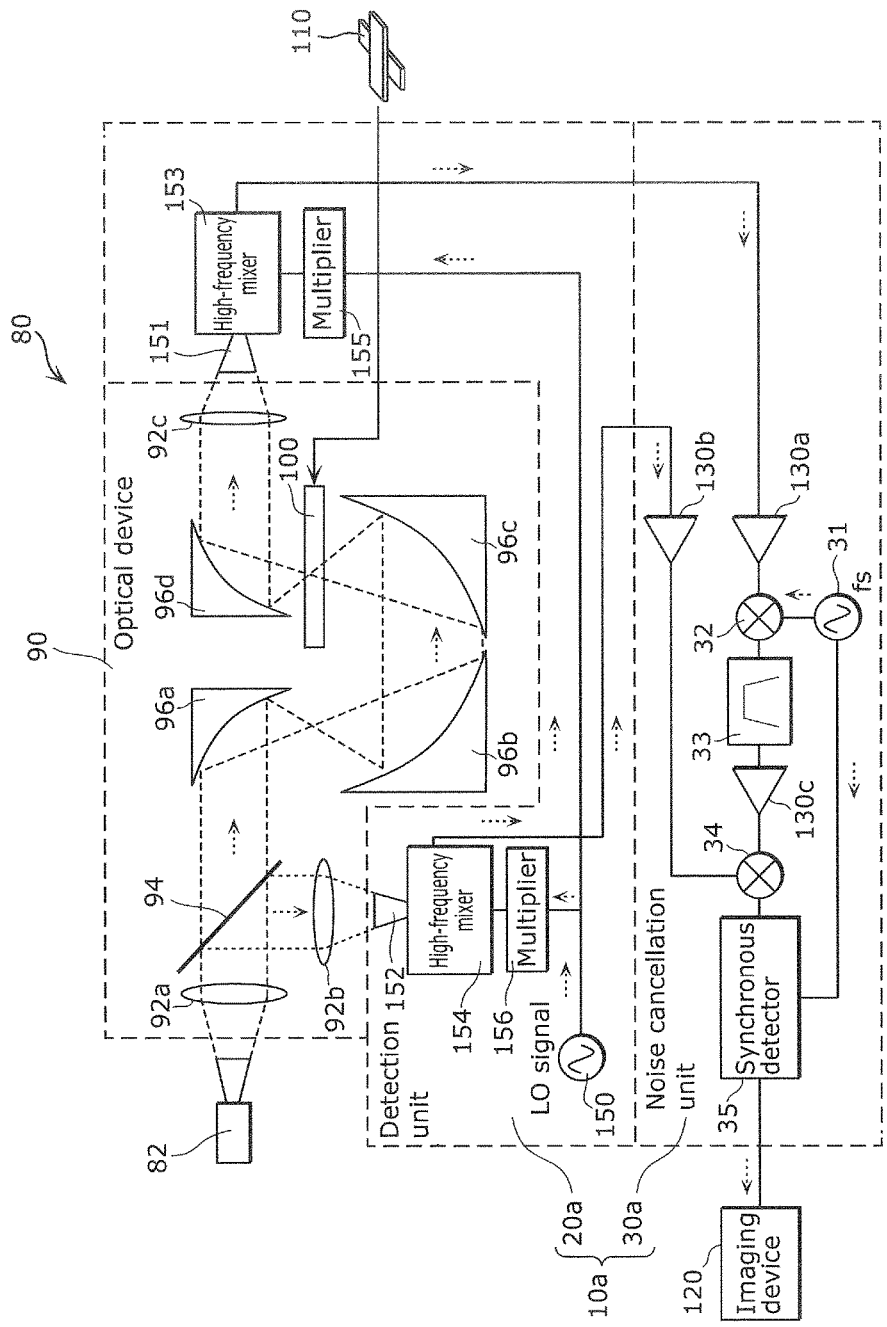
FIG. 14 is a block diagram illustrating a configuration of a phase imaging device using an electromagnetic field measurement device according to an embodiment of the present disclosure.

FIG. 14 is a block diagram illustrating a configuration of a phase imaging device 80 using the electromagnetic field measurement device according to the above-described embodiment.

The phase imaging device 80 is a device that measures and images a shift in phase of electromagnetic waves when transmitting through or reflecting off (in this application example, reflecting off) an object 100. The phase imaging device 80 includes an electromagnetic wave source 82, an optical device 90, a positioning stage 110, an electromagnetic field measurement device 10a (a detection unit 20a and a noise cancellation unit 30a), and an imaging device 120.

The electromagnetic wave source 82 is a device that emits an electromagnetic wave.

The optical device 90 is an optical system that splits the electromagnetic wave emitted from the electromagnetic wave source 82 into a first electromagnetic wave and a second electromagnetic wave. The optical device 90 includes collection lenses 92a through 92c, a beam splitter 94, and parabolic mirrors 96a through 96d. The electromagnetic wave emitted from the electromagnetic wave source 82 is converted into collimated light by the collection lens 92a and split into a first electromagnetic wave and a second electromagnetic wave by the beam splitter 94. The first electromagnetic wave is reflected by the parabolic mirrors 96a through 96d, and collected by the collection lens 92c. In this application example, the object 100 is disposed on the path of light between the parabolic mirror 96c and the parabolic mirror 96d, and the first electromagnetic wave passes through object 100.

The positioning stage 110 is one example of a mechanism (in this embodiment, an XY stage) that changes the relative positional relationship between the object 100 and the first electromagnetic wave such that only the first electromagnetic wave among the first electromagnetic wave and the second electromagnetic wave split by the optical device 90 is sequentially scanned across so as to be incident on a plurality of measurement points in a two-dimensional plane on the object 100. In this application example, the positioning stage 110 is controlled by the imaging device 120 so as to move the object 100. Note that the relative positional relationship between the object 100 and the first electromagnetic wave may be changed by changing the direction of incidence of the first electromagnetic wave on the object 100 using, for example, a galvanometer mirror.

The electromagnetic field measurement device 10a is a device that measures, at each of the plurality of measurement points on the object 100, the difference in phase between the first electromagnetic wave that has transmitted through or reflected off the object 100 and the second electromagnetic wave that has not transmitted through or reflected off the object 100. In this application example, the electromagnetic field measurement device 10a, in functional terms, is the same device as the electromagnetic field measurement device 10 according to the above-described embodiment, and includes the detection unit 20a and the noise cancellation unit 30a.

The detection unit 20a is a device that detects the first electromagnetic wave and the second electromagnetic wave obtained by the optical device 90 and converts them into electric signals. The detection unit 20a includes a local oscillator 150, horn antennas 151 and 152, high-frequency mixers 153 and 154, and multipliers 155 and 156. The local oscillator 150 is an oscillator that outputs the LO signal in the detection unit 20 of the above-described electromagnetic field measurement device 10. The horn antennas 151 and 152 and the high-frequency mixers 153 and 154 respectively correspond to the first probe 21, the second probe 22, the first frequency converter 23, and the second frequency converter 24 in the detection unit 20 of the electromagnetic field measurement device 10. In this application example, the high-frequency mixer 153 loaded with the horn antenna 151 functions as the first probe (measurement probe) and first frequency converter that detect the first electromagnetic wave that is output from the optical device 90 and passes through or reflects off (in this application example, passes through) the object 100, and the high-frequency mixer 154 loaded with the horn antenna 152 functions as the second probe (reference probe) and second frequency converter that detect the second electromagnetic wave that is output from the optical device 90 and does not pass through or reflect off the object 100 (i.e., the second electromagnetic wave that is generated by the beam splitter 94). The multipliers 155 and 156 multiply the LO signals output from the local oscillator 150, and output them to the high-frequency mixers 153 and 154, respectively.

The noise cancellation unit 30a is a processing unit that detects a difference in phase between the first IF signal output from the first probe (the high-frequency mixer 153 loaded with the horn antenna 151) of the detection unit 20a and the second IF signal output from the second probe (the high-frequency mixer 154 loaded with the horn antenna 152) of the detection unit 20a. The noise cancellation unit 30a includes, in addition to the components included in the noise cancellation unit 30 of the above-described electromagnetic field measurement device 10 (i.e., the reference signal generator 31, the first multiplier 32, the filter 33, the second multiplier 34, and the synchronous detector 35), amplifiers 130a through 130c for amplifying signals.

The imaging device 120 is a processing unit that images the difference in phase measured by the electromagnetic field measurement device 10a at each of the plurality of measurement points on the object 100 (the phases of the signal components extracted by the synchronous detector 35 of the noise cancellation unit 30a) in accordance with the coordinates for the corresponding measurement point. For example, the imaging device 120 is a personal computer connected to an output terminal of the synchronous detector 35 and a control input terminal of the positioning stage 110. More specifically, the imaging device 120 controls the positioning stage 110 so as to move the object 100 so that the first electromagnetic wave generated by the beam splitter 94 is incident at one of the plurality of two-dimensional measurement points on the object 100, and in that state, obtain the difference in phase measured by the electromagnetic field measurement device 10a and store the obtained difference in phase in association with the coordinates for the measurement point. The imaging device 120 is configured to repeat these processes for each of the plurality of measurement points. Then, the imaging device 120 performs the imaging by converting the difference in phase obtained for each of the plurality of measurement points into an image value (for example, converts greater differences in phase into bluer color tones) and then displaying the image value in association with the coordinates for the measurement point.

Note that the difference in phase measured by the electromagnetic field measurement device 10a includes a difference in phase based on the difference in the propagation lengths of the first electromagnetic wave and the second electromagnetic wave in the optical device 90 (i.e., an offset phase difference), but since this offset phase difference is constant regardless of the measurement point, by excluding the offset phase difference from the measured difference in phase, it is possible to obtain a net phase difference resulting from transmission through the object 100.

Figure 15:
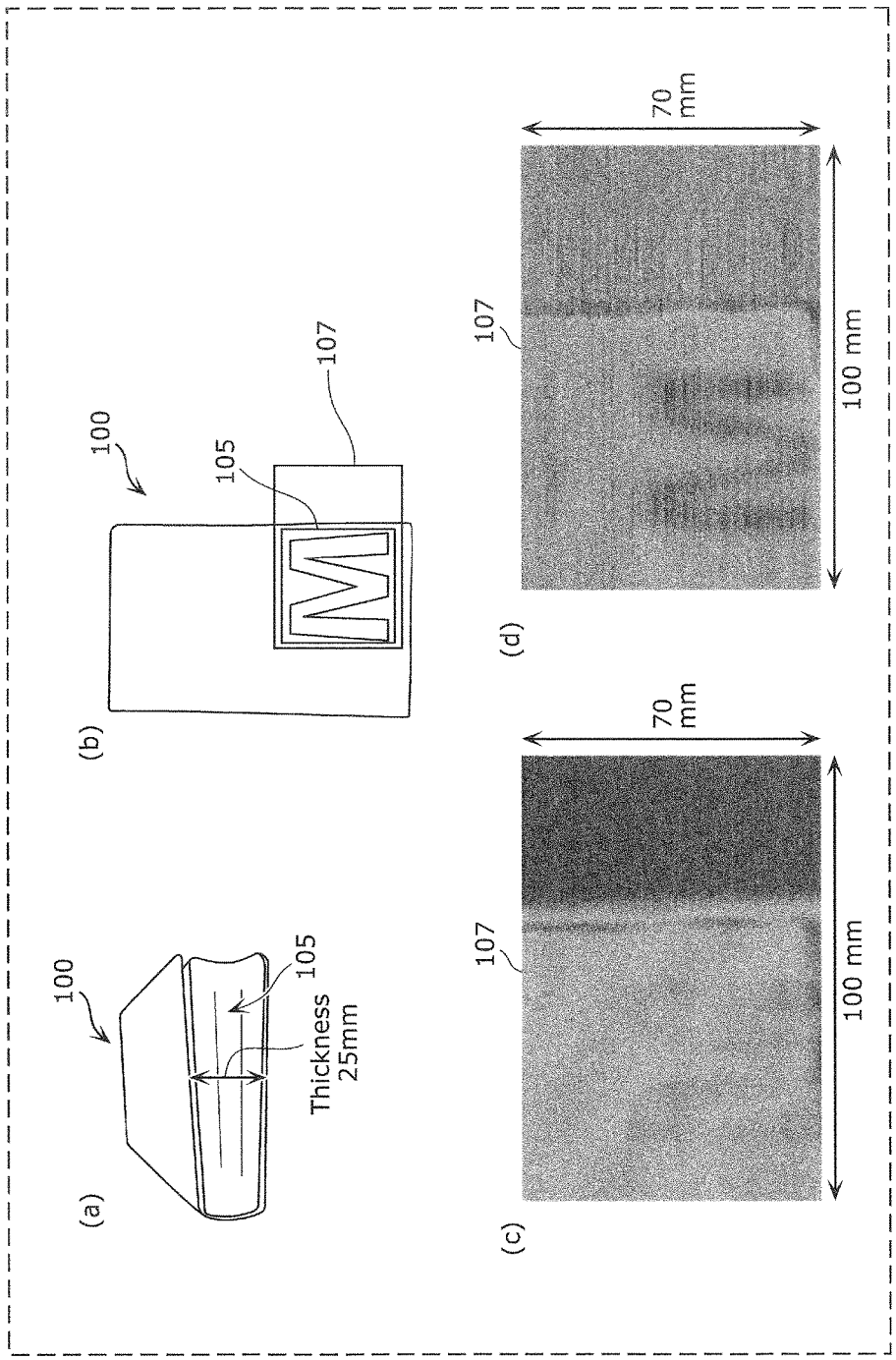
FIG. 15 is for illustrating an experiment performed using the phase imaging device illustrated in FIG. 14.

FIG. 15 is for illustrating an experiment performed using the phase imaging device 80 illustrated in FIG. 14. In (a) in FIG. 15, the external appearance of the object 100 is illustrated, and in (b) in FIG. 15, an inside of the object 100 is illustrated. Here, the object 100 is a book (having a thickness of 25 mm) (see (a) in FIG. 15) in which an acrylic sheet 105 on which the letter "M" is printed (the size of the letter "M" is 50 mm×50 mm) (see (b) in FIG. 15) is inserted. In FIG. 15, (c) illustrates an example of an image for reference purposes (an example of an image of the 70 mm×100 mm region 107 illustrated in (b) in FIG. 15), that is to say, illustrates an example of an image obtained via amplitude imaging (an example of an image corresponding to the product of the amplitudes of the signals obtained by the first probe and the second probe in the electromagnetic field measurement device 10a). In FIG. 15, (d) illustrates an example of an image obtained by the phase imaging device 80 according to this application example via phase imaging (an example of an image of the 70 mm×100 mm region 107 illustrated in (b) in FIG. 15).

Note that in this experiment, as the electromagnetic wave source 82, a Gunn oscillator that outputs relatively high-output millimeter waves of approximately 10 mW was used, and the frequency of the millimeter waves varies by approximately 3 MH. The LO signal output from the local oscillator 150 is approximately 9.7 GHz. This LO signal is multiplied 8 times by the multipliers 155 and 156 and then input into the high-frequency mixers 153 and 154. The first IF signal and the second IF signal, which have been frequency-converted by approximately 5 MHz, are output from the high-frequency mixers 153 and 154, respectively, and the first IF signal and the second IF signal are respectively amplified by the amplifiers 130a and 130b of noise cancellation unit 30a and input into the first multiplier 32 and second multiplier 34 respectively. The frequency fs of the reference signal output from the reference signal generator 31 in the noise cancellation unit 30a is 1.7 MHz.

As the example of the image illustrated in (c) in FIG. 15 shows, since the amount of millimeter waves absorbed by the acrylic sheet 105 is small, the amplitude imaging produces a low-contrast image that is unclear. However, as the example of the image illustrated in (d) in FIG. 15 shows, phase imaging produces a high-contrast image.

In this way, with the phase imaging device 80 according to this application example, since fluctuations in the phase and frequency of the electric field or magnetic field in the target electromagnetic field are cancelled, even though a variable-frequency electromagnetic wave source 82 is used, it is possible to obtain a high-contrast view of the inside of the object 100 without damaging the object 100. In other words, with this application example, even when there is frequency fluctuation in the case of high-output and a light source (electromagnetic wave source 82) is used with which phase synchronization with an external source is difficult, it is possible to stably perform high-precision phase imaging.

Note that with the phase imaging device 80 according to this application example, transmission-based imaging is performed, but reflection-based imaging may be performed.

Moreover, with the phase imaging device 80 according to this application example, functionally speaking, the electromagnetic field measurement device 10a is the same device as the electromagnetic field measurement device 10 according to the above-described embodiment, but the electromagnetic field measurement device 10a is not limited to this example. The electromagnetic field measurement device 10a may be an electromagnetic field measurement device including the electromagnetic field measurement device 11 according to Variation 1 of the above-described embodiment or the noise cancellation unit 60 according to Variation 2 of the above-described embodiment.

Note that when a plurality of probes are moved together, it is necessary to know the offset phase included in the reference signal input into the synchronous detector 35 from the reference signal generator 31. This is in order to subtract the offset phase from the measured phase difference, since the signal output from the synchronous detector 35 includes the offset phase as noise. Hereinafter, a calculation method of such an offset phase will be described.

Figure 16:
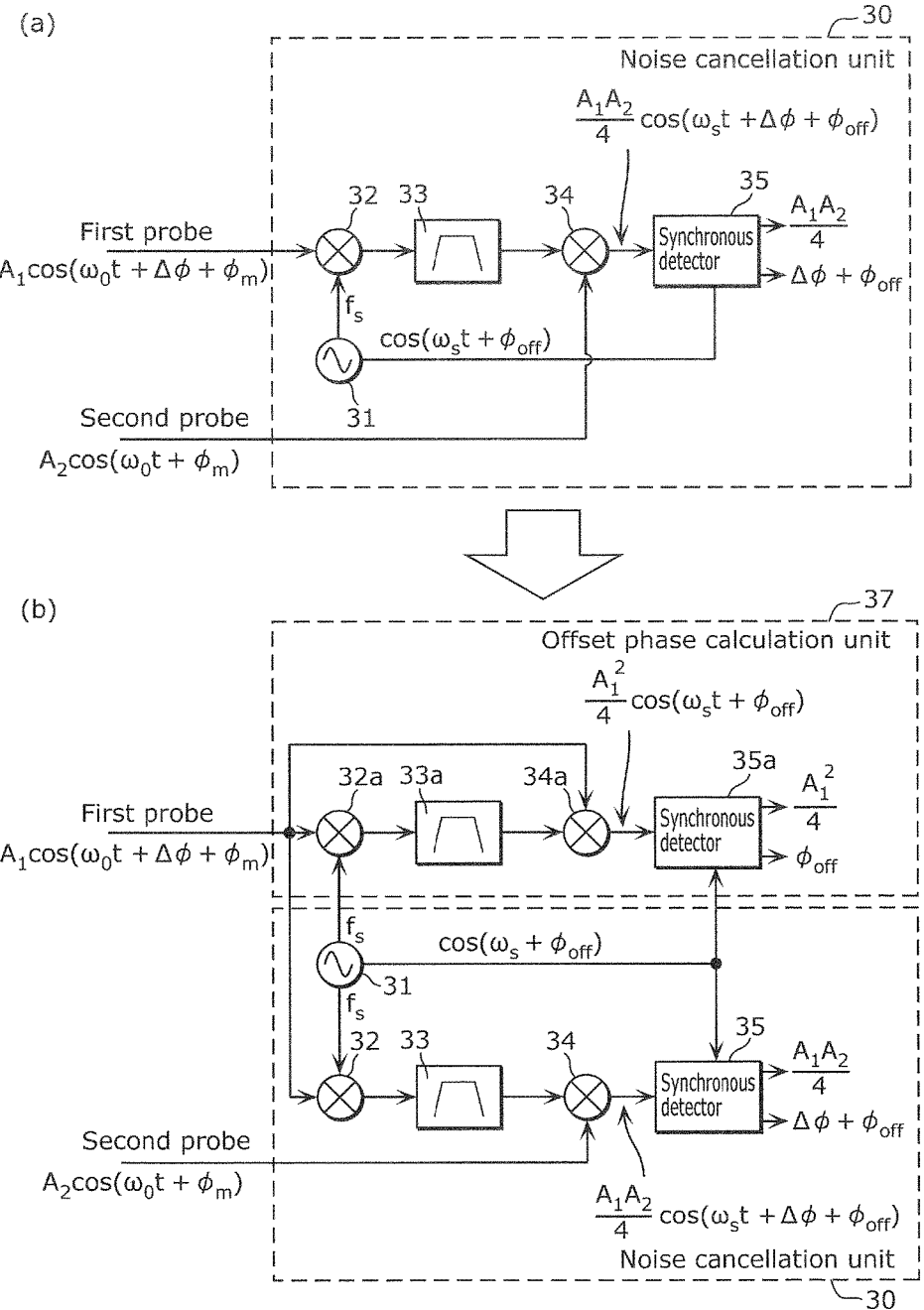
FIG. 16 is for illustrating a method for calculating the offset phase included in the reference signal input into a synchronous detector from a reference signal generator.

FIG. 16 is for illustrating a method for calculating the offset phase $\Phi_{off}$ included in the reference signal input into the synchronous detector 35 from the reference signal generator 31. In FIG. 16, (a) illustrates the effect the offset phase $\Phi_{off}$ has in the noise cancellation unit 30, and (b) is a block diagram illustrating a circuit configuration of a circuit in which a circuit for calculating the offset phase $\Phi_{off}$ (the offset phase calculation unit 37) has been added to the noise cancellation unit 30 described above.

As illustrated in (a) in FIG. 16, the signal output from the first probe is $A_1 \cos(\omega_0 t + \Delta\Phi + \Phi_m)$ and the signal output from the second probe is $A_2 \cos(\omega_0 t + \Phi_m)$. Here, $\omega_0$ is the angular frequency of the target electromagnetic field, $\Delta\Phi$ is the difference in phase in the target electromagnetic field at the position of the first probe and the position of the second probe, and $\Phi_m$ is the phase fluctuation of the target electromagnetic field. Moreover, the reference signal input into the first multiplier 32 from the reference signal generator 31 is a frequency fs (angular frequency $\omega_s$) signal, and the reference signal input into the second multiplier 34 from the reference signal generator 31 is a cos $(\omega_s t+\Phi_{off})$ signal. Here, $\Phi_{off}$ is the offset phase of the reference signal (the offset phase based on the reference signal input into the first multiplier 32).

In this state, based on the principle described in the above embodiment, the signal output from the second multiplier 34 is $(A_1A_2/4)$ cos $(\omega_s t+\Delta\Phi+\Phi_{off})$. Accordingly, the phase of the signal component extracted by the synchronous detector 35 is $(\Delta\Phi+\Phi_{off})$. In other words, the phase of the signal component is a value obtained by adding the offset phase $\Phi_{off}$ of the reference signal to the phase difference $\Delta\Phi$ to be calculated. Accordingly, it is necessary to know the offset phase $\Phi_{off}$ of the reference signal.

Therefore, as shown in (b) in FIG. 16, a circuit (the offset phase calculation unit 37) for calculating the offset phase $\Phi_{off}$ of the reference signal is added to the noise cancellation unit 30 illustrated in (a) in FIG. 16. The offset phase calculation unit 37 includes the first multiplier 32 included in the noise cancellation unit 30, and a first multiplier 32a, filter 33a, second multiplier 34a, and synchronous detector 35a that have the same function as the first multiplier 32, filter 33, second multiplier 34, and synchronous detector 35, respectively. The signal output from the first probe is input in parallel to the second multiplier 34 in addition to the first multiplier 32a. Moreover, the reference signal from the reference signal generator 31 included in the noise cancellation unit 30 is input into the first multiplier 32a and the synchronous detector 35a.

With such an offset phase calculation unit 37, the output signal from the first probe and the reference signal are multiplied together in the first multiplier 32a, and that output signal is further multiplied in the second multiplier 34 with the output signal from the first probe. Accordingly, the signal output from the second multiplier 34 is $(A_1^2/4)$ cos $(\omega_s t+\Phi_{off})$. Accordingly, the amplitude of the signal component extracted by the synchronous detector 35 is $(A_1^2/4)$ and the phase is $\Phi_{off}$. In other words, the offset phase calculation unit calculates the offset phase $\Phi_{off}$ of the reference signal. Accordingly, the phase difference $\Delta\Phi$ of the target electromagnetic field at the position of the first probe and the position of the second probe can be calculated by subtracting the offset phase $\Phi_{off}$ calculated by the offset phase calculation unit 37 from the phase $(\Delta\Phi+\Phi_{off})$ calculated by the noise cancellation unit 30.

Note that with the offset phase calculation unit 37, as can be seen from the acquisition of the amplitude $(A_1^2/4)$, there is an advantage that it is possible to measure, with high sensitivity, the amplitude $A_1$ of the output signal from the first probe as well. However, the detection of the power of the IF signal or a detection using a rectifying circuit, for example, may be used in order to detect the amplitude $A_1$.

In this way, with the offset phase calculation unit 37, by multiplying the reference signal by the signal obtained via the first probe, multiplying the resulting signal by the signal obtained via the first probe, then extracting, from the resulting signal, a signal component synchronous with the reference signal, the offset phase $\Phi_{off}$ of the reference signal can be calculated (offset phase calculation step). With this, when a plurality of probes are moved together, the offset phase $\Phi_{off}$ of the reference signal is calculated simultaneously with the measurement of the target electromagnetic field, and it is possible to calculate the phase difference with high precision by subtracting the offset phase $\Phi_{off}$ as noise from the phase of the signal component extracted by the synchronous detector 35.

Here, the method for calculating the offset phase $\Phi_{off}$ of the reference signal is not limited to the method using the offset phase calculation 37 illustrated in FIG. 16. For example, the positions of the first probe and the second probe may be reversed to measure $\Phi_1-\Phi_2+\Phi_{off}$ and $\Phi_2-\Phi_1+\Phi_{off}$ and these may be added together to calculate $\Phi_{off}$. Here, $\Phi_1$ is the phase of the target electromagnetic field at the position of the first probe, and $\Phi_2$ is the phase of the target electromagnetic field at the position of the second probe.

Note that the reversing of the positions of the first probe and the second probe may be accomplished by switching via an electronic switch. For example, at a given measurement point, the positions of the first probe and the second probe may be switched via an electronic switch and measured, that is to say, measurement may be performed twice. Then, the first probe and second probe are moved to the next measurement point and the same processing may be repeated.

In this way, a phase calculation step of calculating an offset phase $\Phi_{off}$ of the reference signal by performing the first multiplication step, the second multiplication step, and the synchronous detection step in a state in which, for one of the plurality of measurement points, positions of the first probe and the second probe in the arrangement step are reversed, and, in the arrangement step, adding a phase $(\Phi_1-\Phi_2+\Phi_{off})$ of a signal component extracted in the synchronous detection step and a phase $(\Phi_2-\Phi_1+\Phi_{off})$ of a signal component extracted in the synchronous detection step after reversing the positions may be performed. With this, when a plurality of probes are moved together, the offset phase of the reference signal can be calculated by reversing the positions of the probes, and the phase difference can be calculated with high precision by subtracting the offset phase $\Phi_{off}$ as noise from the phase of the signal component extracted by the synchronous detector 35.

Hereinbefore, the electromagnetic field measurement device, electromagnetic field measurement method, and phase imaging device according to the present disclosure have been described based on embodiments and variations, but the present disclosure is not limited to these embodiments and variations. Various modifications to the embodiments as well as embodiments resulting from arbitrary combinations of elements of the embodiments and variations thereof that may be conceived by those skilled in the art are intended to be included within the scope of the present disclosure as long as these do not depart from the main purport of the present disclosure.

For example, in the above-described embodiment, among the two signal components (signal components whose frequencies are respectively equivalent to the sum and difference of the frequencies of the two input signals) output from the first multiplier 32, the signal component whose frequency is equivalent to the difference is used, but the signal component whose frequency is equivalent to the sum may be used. In such a case, among the two signal components (signal components whose frequencies are respectively equivalent to the sum and difference of the frequencies of the two input signals) output from the second multiplier 34, the signal component whose frequency is equivalent to the difference is detected by the synchronous detector 35 as the signal component synchronous with the reference signal. In this way, just like in Embodiment 1, only the signal component having the frequency fs $(=f_s+f_{IF}-f_{IF})$ of the reference signal obtained by cancelling the phase and frequency fluctuations in the target electric field and cancelling the signal component dependent on the intermediate frequency is extracted.

Moreover, in Variation 1 of the above-described embodiment, an optical filter, for example, is used as the EO detector, but the EO detector is not limited to this example. For example, the EO detector may have the same configuration as the polarization processing device disclosed in Japanese Unexamined Patent Application Publication No. 2007-57324 (PTL 2).

Figure 17:
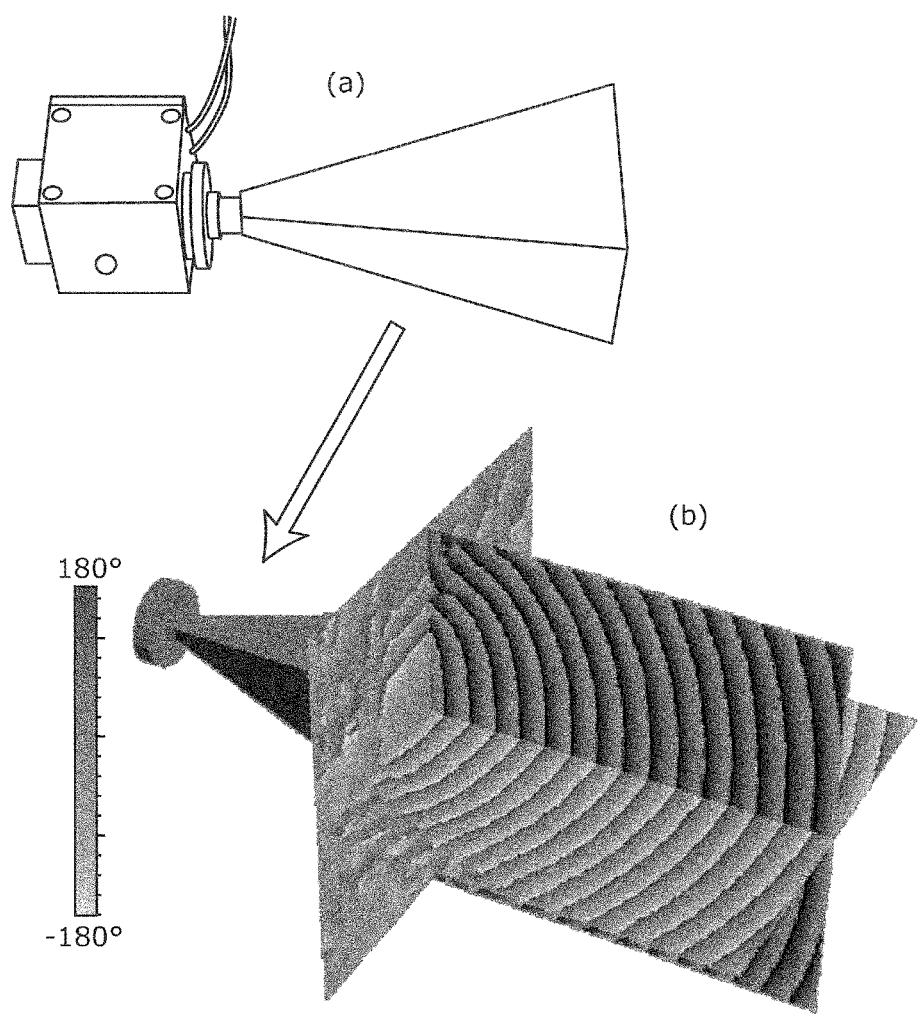
FIG. 17 illustrates an example of a visible spatial distribution of the phase of the target electromagnetic field obtained by an electromagnetic field measurement device according to the present disclosure.

Moreover, the spatial distribution of the phase and amplitude of the target electromagnetic field obtained by the electromagnetic field measurement device according to, for example, the above-described embodiment, may be visualized. FIG. 17 illustrates an example of a visible spatial distribution of the phase of the target electromagnetic field obtained by an electromagnetic field measurement device equivalent to that described in Variation 1 of the above-described embodiment. In this experiment, an RF signal generated by a Gunn oscillator that self-oscillates at approximately 77.7 GHz was emitted from a horn antenna such as the one shown in (a) in FIG. 17. The Gunn diode used had frequency fluctuation at approximately ±300 kHz. One probe of the electromagnetic field measurement device was fixed at a single point in the space and the other probe was moved in the space to obtain a spatial distribution of the phase of the target electromagnetic field. Using a computer, in accordance with the color (here, greyscale) bar illustrated in FIG. 17, which indicates corresponding colors (here, shades of grey) and phase levels, the obtained phases were converted into their corresponding colors (here, shades of grey) to generate an image that corresponds to the measurement points (i.e., to visualize the distribution). Note that since FIG. 17 is a black and white image, the change in color is expressed using shades of grey, but may be expressed in color. The part in (b) in FIG. 17 that corresponds to the spatial distribution is visible data indicating the result of the experiment, and the part that corresponds to the horn antenna is CAD data. By making the spatial distribution of the phase and amplitude of the target electromagnetic field visible in this manner, it is possible to intuitively comprehend the spatial distribution of the phase and amplitude of the target electromagnetic field.

Moreover, in Variation 2 of the above-described embodiment, the noise cancellation unit 60 is implemented via the program 64, but may be implemented via a logical circuit including, for example, a DSP or digital filter and FPGA.

Moreover, in the phase imaging device 80 according to the above-described application example, two one-dimensional probes are used, but three two-dimensional probes may be used. The mixer may have a two-dimensional array. With this, the time required to scan the plurality of two-dimensionally arranged measurement points on the object 100 can be shortened.

Moreover, in the method for measuring the electromagnetic field and the electromagnetic field measurement device according to, for example, the above-described embodiment, instead of moving three probes, an array of probes arranged in a two-dimensional array, such as with a CCD camera, may be used. With this, without having to move the probes, it is possible to measure the spatial distribution of the electric field or magnetic field by measuring the relative phase between the probes in the array or measuring relative phase using one point as a reference point. Similarly, instead of moving two probes, an array of probes arranged in a one-dimensional array may be used.

In the above-described embodiment, for example, probes are arranged in a space to measure the radiation electromagnetic field radiated from, for example, an antenna, but probes may be arranged to measure circuit potential. In either case, the processing of the voltage signals obtained via the probes is the same. Accordingly, in this specification, "arranging probes in a space for measuring the electric field or magnetic field" includes not only a case in which probes are arranged in a space to measure the radiated electric field or radiated magnetic field, but also a case in which probes are arranged in a circuit to measure potential.

INDUSTRIAL APPLICABILITY

The present disclosure is applicable as a method for measuring an electromagnetic field, an electromagnetic field measurement device, and a phase imaging device that stably and precisely measure a spatial distribution of an electric field or magnetic field. For example, the present disclosure is applicable as a device for analyzing a radiation pattern from a circuit in which a radiating body such as an antenna is integrated (on-chip antenna) and as an inspection device that visualizes the inside of an object without damaging the object.

The invention claimed is:
1. A method for measuring an electromagnetic field, the method comprising steps of:
 (a) arranging a first probe and a second probe in a space to measure an electric field or a magnetic field;
 (b) multiplying a reference signal generated by a reference signal generator by a signal obtained via the first probe;
 (c) multiplying a signal obtained via the second probe by a signal obtained via step (b); and
 (d) extracting, from a signal obtained via step (c), a signal component that is synchronous with the reference signal generated by the reference signal generator.
2. The method according to claim 1, wherein
in step (a), while the second probe is fixed in the space, the first probe is arranged at a plurality of measurement points in the space by sequentially moving the first probe to the plurality of measurement points, and
step (b), step (c), and step (d) are performed each time the first probe is arranged at a measurement point among the plurality of measurement points in step (a).
3. The method according to claim 1, wherein
in step (a), while a distance between the first probe and the second probe is fixed, the first probe and the second probe are arranged at a plurality of measurement points in the space by sequentially moving the first probe and the second probe together to the plurality of measurement points, and
step (b), step (c), and step (d) are performed each time the first probe and the second probe are arranged at a measurement point among the plurality of measurement points in step (a).
4. The method according to claim 3, wherein
in step (a), the first probe and the second probe are moved together such that a position of one of the first probe and the second probe at a current one of the plurality of measurement points and a position of an other of the first probe and the second probe at a next one of the plurality of measurement points are a same point.
5. The method according to claim 3, wherein
in step (a), the first probe and the second probe are moved together such that one of the first probe and the second probe is sequentially arranged at a plurality of positions obtained by dividing the distance between the first probe and the second probe at a predetermined point in time.

6. The method according to claim 3, further comprising a step of:
(e) calculating an offset phase of the reference signal by (i) multiplying the reference signal by the signal obtained via the first probe, (ii) multiplying a signal resulting from (i) by the signal obtained via the first probe, and (iii) extracting a signal component that is synchronous with the reference signal from a signal resulting from (ii).

7. The method according to claim 3, further comprising a step of:
(e) calculating an offset phase of the reference signal by performing step (b), step (c), and step (d) in a state in which, for one of the plurality of measurement points, positions of the first probe and the second probe are reversed, and, in step (a), adding a phase of a signal component extracted in step (d) and a phase of a signal component extracted in step (d) after reversing the positions.

8. An electromagnetic field measurement device, comprising:
a first probe and a second probe arranged in a space to measure an electric field or a magnetic field;
a reference signal generator that generates a reference signal;
a first multiplier that multiplies the reference signal by a signal obtained via the first probe;
a second multiplier that multiplies a signal obtained via the second probe by a signal output from the first multiplier; and
a synchronous detector that extracts, from a signal output from the second multiplier, a signal component that is synchronous with the reference signal.

9. The electromagnetic field measurement device according to claim 8, further comprising:
a first frequency converter that converts a frequency of a signal output from the first probe into an intermediate frequency lower than a frequency of the signal output from the first probe; and
a second frequency converter that converts a frequency of a signal output from the second probe into the intermediate frequency,
wherein the first multiplier multiplies the reference signal by a signal output from the first frequency converter, and
the second multiplier multiplies a signal output from the second frequency converter by the signal output from the first multiplier.

10. The electromagnetic field measurement device according to claim 8, further comprising:
a filter that selects, from the signal output from the first multiplier, a signal component having a frequency that is a sum of or a difference between a frequency of a signal input into the first multiplier and a frequency of the reference signal,
wherein the second multiplier multiplies a signal output from the second probe by a signal output from the filter.

11. The electromagnetic field measurement device according to claim 9, wherein
the first probe and the second probe output optical signals dependent on a detected electric field,
the first frequency converter converts the optical signal output from the first probe into an electric signal having an intermediate frequency lower than a frequency of the optical signal output from the first probe, the second frequency converter converts the optical signal output from the second probe into an electric signal having the intermediate frequency,
the first multiplier multiplies the reference signal by the electric signal output from the first frequency converter, and
the second multiplier multiplies the electric signal output from the second frequency converter by the signal output from the first multiplier.

12. An electromagnetic field measurement device, comprising:
a first probe and a second probe arranged in a space to measure an electric field or a magnetic field;
a first analog/digital (A/D) converter that converts a signal obtained via the first probe into a digital value;
a second A/D converter that converts a signal obtained via the second probe into a digital value; and
a computer device that processes signals output from the first A/D converter and the second A/D converter,
wherein the computer device executes steps of:
(a) multiplying a reference signal by the signal output from the first A/D converter;
(b) multiplying the signal output from the second A/D converter by a signal obtained via step (a); and
(c) extracting, from a signal obtained via step (b), a signal component that is synchronous with the reference signal.

13. A non-transitory computer-readable recording medium having a computer program recorded thereon for causing the computer device according to claim 12 to execute step (a), step (b), and step (c).

14. A phase imaging device that measures and images a shift in phase of an electromagnetic wave when transmitting through or reflecting off an object, the phase imaging device comprising:
an electromagnetic wave source that emits the electromagnetic wave;
an optical device that splits the electromagnetic wave emitted from the electromagnetic wave source into a first electromagnetic wave and a second electromagnetic wave;
a mechanism configured to change a relative positional relationship between the object and the first electromagnetic wave such that only the first electromagnetic wave among the first electromagnetic wave and the second electromagnetic wave split by the optical device is sequentially scanned across a plurality of measurement points in a two-dimensional plane on the object;
the electromagnetic field measurement device according to claim 8 that measures, at each of the plurality of measurement points, a difference in phase between the first electromagnetic wave that has transmitted through or reflected off the object and the second electromagnetic wave that has not transmitted through or reflected off the object; and
an imaging device that images the difference in phase measured by the electromagnetic field measurement device in correspondence to each of the plurality of measurement points,
wherein the electromagnetic field measurement device detects the first electromagnetic wave using the first probe included in the electromagnetic field measurement device and the second electromagnetic wave using the second probe included in the electromagnetic field measurement device, and the imaging device images a phase of the signal component extracted by the synchronous detector included in the electromagnetic field measurement device as the difference in phase.

\* \* \* \* \*